United States Patent
Bando et al.

(10) Patent No.: US 9,904,259 B2
(45) Date of Patent: Feb. 27, 2018

(54) PLATE MEMBER REVERSING SYSTEM AND REVERSING/TRANSFER METHOD THEREOF

(75) Inventors: Kenji Bando, Kobe (JP); Toshihiko Miyazaki, Kobe (JP); Shuhei Kuraoka, Kakogawa (JP)

(73) Assignee: KAWASAKI JUKOGYO KABUSHIKI KAISHA, Kobe-shi (JP)

( * ) Notice: Subject to any disclaimer, the term of this patent is extended or adjusted under 35 U.S.C. 154(b) by 767 days.

(21) Appl. No.: 14/110,279

(22) PCT Filed: Mar. 30, 2012

(86) PCT No.: PCT/JP2012/002234
§ 371 (c)(1),
(2), (4) Date: Nov. 26, 2013

(87) PCT Pub. No.: WO2012/137453
PCT Pub. Date: Oct. 11, 2012

(65) Prior Publication Data
US 2014/0081443 A1    Mar. 20, 2014

(30) Foreign Application Priority Data

Apr. 5, 2011   (JP) ................. 2011-084052

(51) Int. Cl.
G05B 15/02   (2006.01)
B65G 49/06   (2006.01)
H01L 21/677  (2006.01)

(52) U.S. Cl.
CPC .......... *G05B 15/02* (2013.01); *B65G 49/067* (2013.01); *B65G 49/068* (2013.01);
(Continued)

(58) Field of Classification Search
CPC .................................. G05B 15/02
See application file for complete search history.

(56) References Cited

U.S. PATENT DOCUMENTS

| | | |
|---|---|---|
| 3,827,548 A | 8/1974 | Matsuo |
| 4,217,977 A | 8/1980 | Tam |
| | (Continued) | |

FOREIGN PATENT DOCUMENTS

| | | |
|---|---|---|
| DE | 10 2006 011 870 A1 | 9/2007 |
| EP | 0 101 025 A2 | 2/1984 |
| | (Continued) | |

OTHER PUBLICATIONS

Aug. 18, 2014 Office Action issued in Chinese Application No. 201280015322.2 (with partial translation).
(Continued)

*Primary Examiner* — Kenneth M Lo
*Assistant Examiner* — David Wynne
(74) *Attorney, Agent, or Firm* — Oliff PLC

(57) ABSTRACT

A plate member reversing system adapted for sequentially reversing and transferring a plurality of plate members, includes a second delta robot, a reversing device and a second transfer device. The second delta robot is configured such that it sequentially holds the plate members and transfers and places them onto the reversing device. The reversing device, onto which the plate member is transferred and placed in a horizontal position by the second delta robot, is configured such that, while the transferred and placed plate member is being held by application of suction with its upper surface in an open state, it reverses the upper and the lower surfaces of the plate member. In addition, the second transfer device receives the reversed plate member from the reversing device and transfers it in a reversed state and in a horizontal position.

7 Claims, 22 Drawing Sheets

(52) U.S. Cl.
  CPC .. *H01L 21/67718* (2013.01); *H01L 21/67778* (2013.01); *B65G 2249/04* (2013.01)

(56) References Cited

U.S. PATENT DOCUMENTS

| | | | | |
|---|---|---|---|---|
| 4,344,380 A | * | 8/1982 | Matsumiya | ............... G03F 7/16 118/314 |
| 5,682,734 A | * | 11/1997 | Laster | ..................... B65B 5/045 53/255 |
| 2008/0156357 A1 | | 7/2008 | Mitsuyoshi | |

FOREIGN PATENT DOCUMENTS

| | | | | |
|---|---|---|---|---|
| GB | 2 338 468 A | | 12/1999 | |
| GB | 2338468 A | * | 12/1999 | ........... B65G 47/252 |
| JP | S4948076 A | | 5/1974 | |
| JP | U-1-147344 | | 10/1989 | |
| JP | U-147344 | | 10/1989 | |
| JP | A-2009-252888 | | 10/2009 | |
| JP | A-2011-1174 | | 1/2011 | |

OTHER PUBLICATIONS

International Search Report issued in International Patent Application No. PCT/JP2012/002234 dated Apr. 24, 2012.
Extended European Search Report issued in European Patent Application No. 12767840.7 dated Oct. 6, 2014.

* cited by examiner

PLATE MEMBER REVERSING SYSTEM AND REVERSING/TRANSFER METHOD THEREOF

TECHNICAL FIELD

The present invention relates to a plate member reversing system for reversing a plate member such as a film, a plate of glass and the like, and to a plate member reversing/transfer method thereof.

BACKGROUND ART

In the process treatment, it may be required that both surfaces of a plate member, such as a film, a plate of glass et cetera, be subjected to a process treatment. In this case, there is employed a reversing device so that, after execution of the process treatment on the obverse surface of the plate member, the plate member is reversed. As an example of the reversing device, there is known a transfer/placing robot disclosed, for example, in Patent Literature 1.

The reversing device set forth in Patent Literature 1 has a plate member holding frame. There are formed, in the holding frame, a fixing member and a movable member, and the plate member transferred to the reversing device is supported, by these members, at its edge portions respectively on one surface side and on the opposite surface side. This reversing device is configured such that one surface of the plate member is supported by the fixing member while the opposite surface is supported by the movable member, and the plate member holding frame is rotated to reverse the plate member.

CITATION LIST

Patent Literature

Patent Literature 1: JP-A-2011-1174

SUMMARY OF INVENTION

Technical Problem

However, according the reversing device of Patent Literature 1, the plate member is simply supported by abutment, as a result of which the plate member moves within the plate member holding frame. Therefore, if the plate member is reversed at high speeds in the plate member holding frame, the plate member is pressed outward against the plate member holding frame by the resulting centrifugal force, so that the plate member is likely to be damaged. Additionally, in the reversing device, the plate member is reversed with its both surfaces being held by the fixing and the movable members. This consequently causes the possibility that the process-treated obverse surface may be damaged, and therefore the reversing device is unsuitable for use in the process treatment equipment.

Accordingly, the object of the present invention is to provide a plate member reversing system capable of reversing a plate member at a high speed and, in addition, capable of reversing a plate member without damaging the upper surface of the plate member, and a reversing/transfer method thereof.

Solution to Problem

The present invention provides a plate member reversing system for sequentially reversing and transferring a plurality of plate members, the plate member reversing system comprising: an upstream-side transfer/placing robot for performing an upstream-side transfer/placing operation of sequentially holding, and transferring and placing the plurality of plate members; a reversing device, onto which the plate member held by the upstream-side transfer/placing robot is transferred and placed in a horizontal position, for performing a reversing operation of reversing upper and lower surfaces of the plate member, while the transferred and placed plate member is being held with its upper surface in an open state; and a transfer device for receiving the reversed plate member from the reversing device and transferring the received plate member in a reversed state and in a horizontal position.

In accordance with the present invention, by holding the plate member, it becomes possible to improve the speed at which the plate member is reversed and it also becomes possible to improve the accuracy of position of the plate member when it is delivered to the transfer device. Furthermore, since the upper surface of the plate member is in an open state, the upper and lower surfaces of the transferred/placed plate member can be reversed without any damage to the upper surface and can be delivered to the transfer device.

The above plate member reversing system according to the present invention may preferably further comprise a control device which executes control that enables the upstream-side transfer/placing robot, the reversing device and the transfer device to operate intermittently; and wherein the control device is configured such that, while the upstream-side transfer/placing robot is caused to perform the upstream-side transfer/placing operation in a state in which the reversing operation of the reversing device is stopped, the control device causes the transfer device to perform a transfer operation.

In accordance with the above configuration, the period of time for which the reversing device is stopped can be reduced by overlapping the upstream-side transfer/placing operation and the transfer operation with each other. This makes it possible to shorten the time taken to reverse and transfer the plate member.

In the above plate member reversing system according to the present invention, it is preferred that the control device is configured such that, after causing the upstream-side transfer/placing robot to perform the upstream-side transfer/placing operation, the control device causes the upstream-side transfer/placing robot to perform a retracting operation to retract from the reversing device, while causing the reversing device to perform the reversing operation.

In accordance with the above configuration, by control of the operation of the reversing device, it becomes possible to perform the reversing operation and the retracting operation at the same time. This makes it possible to reduce the period of time for which the reversing device is stopped, thereby reducing the time taken to reverse and transfer the plate member.

In the above plate member reversing system according to the present invention, it is preferred that the reversing device includes a suction pad for suctioning the lower surface of the placed plate member, thereby to hold the plate member, and a reversing shaft for rotating the suction pad so that the plate member is reversed.

In accordance with the above configuration, the plate member is held by suctioning performed by the suction pad, and the suction pad is rotated so that the plate member is reversed. Thereby, while holding the plate member without any application of unnecessary forces thereto, it can be reversed. This makes it possible that the present invention can be applicable to the case where it is required that plate members of various forms and materials, for example, films having a small thickness, are reversed.

In the above plate member reversing system according to the present invention, it is preferred that the control device is configured to cause the reversing device to perform the reversing operation and the suction pad to perform a suction operation.

In accordance with the above configuration, in spite of the configuration in which the reversing operation and the suction operation are started at the same time, the plate member can be held by suctioning it even when the suction force applied is small immediately after start of the suction operation, because the plate member is placed on the suction pad immediately after start of the reversing operation. This therefore makes it possible to start the reversing operation and the suction operation at the same time, and thus the period of time for which the reversing device is stopped can be reduced. As a result, it becomes possible to shorten the time taken to reverse and transfer the plate member.

The above plate member reversing system according to the present invention may further comprise further comprise a downstream-side transfer/placing robot, whose operation is controlled by the control device, for holding, and transferring and placing the plate member transferred to a transfer/placing completed position by the transfer device; wherein said control device is configured such that, while the reversing device is caused to perform the reversing operation in a state in which the transfer operation of the transfer device is stopped, the control device causes the downstream-side transfer/placing robot to perform a downstream-side transfer/placing operation so that the plate member transferred to said transfer/placing completed position by the transfer device is transferred and placed in a predetermined position.

In accordance with the above configuration, during when the transfer device is stopped for the reversing operation to be performed, the downstream-side transfer/placing operation is performed, thereby making it possible to make efficient use of the time when the transfer device is stopped. This makes it possible to reduce the time for which the transfer device is stopped, thereby reducing the time taken to transfer the plate member.

In the above plate member reversing system according to the present invention, it is preferred that the transfer device includes a suction mechanism for suctioning the lower surface of the plate member to be transferred; and wherein, after receipt of the plate member from the reversing device, the suction mechanism starts suctioning the received plate member and stops suctioning at the transfer completed position.

In accordance with the above configuration, it becomes possible to prevent displacement of the plate member on the transfer device at the time of transfer, and thus the plate member can be moved quickly while being kept in a predetermined position. This makes it possible for the plate member to be transferred to the transfer completed position in a shorter time. In addition, the accuracy of position of the plate member when it arrives at the transfer completed position can be improved.

The present invention provides a plate member reversing/transfer method for use in a plate member reversing system which includes: an upstream-side transfer/placing robot for sequentially holding, and transferring and placing the plurality of plate members; a reversing device, onto which the plate member held by the upstream-side transfer/placing robot is transferred and placed in a horizontal position, for reversing upper and lower surfaces of the plate member, while the transferred/placed plate member is being held with its upper surface in an open state; and a transfer device for receiving the reversed plate member from the reversing device and transferring the received plate member in a reversed state and in a horizontal position, the method comprising: a transfer/placing step in which the plurality of plate members are sequentially held by the upstream-side transfer/placing robot, and are transferred and placed onto the reversing device; a reversing step in which the plate member transferred and placed in the transfer/placing step is held and reversed by the reversing device, and is delivered to the transfer device; and a transfer step in which the plate member reversed and delivered in the reversing step is transferred by the transfer device.

In accordance with the above configuration, by holding a plate member, it becomes possible to improve the speed at which the plate member is reversed and it also becomes possible to improve the accuracy of position of the plate member when it is delivered to the transfer device. Furthermore, since the upper surface of the plate member is in an open state, the upper and lower surfaces of the transferred/placed plate member can be reversed without any damage to the upper surface, and can be delivered to the transfer device.

Advantageous Effects of Invention

In accordance with the plate member reversing system and its plate member reversing/transfer method of the present invention, it becomes possible that the plate member can be reversed at a high speed and, in addition, the plate member can be reversed without causing damage to the upper surface thereof.

These objects as well as other objects, features and advantages of the present invention will become apparent to those skilled in the art from the following detailed description with reference to the accompanying drawings.

DESCRIPTION OF EMBODIMENTS

Hereinafter, with reference to the above drawing figures, a description will be given in regard to process treatment equipment 4 (herein, also referred to merely as the "treatment equipment 4"). The process treatment equipment 4 is equipped with a plate member transfer system 1 (herein, also referred to merely as the "transfer system 1"), a plate member reversing system 2 (herein, also referred to merely as the "reversing system 2") and a plate member storage system 3 (herein, also referred to merely as the "storage system 3"). References herein to directions such as "up and down", "right and left", "to and fro" mentioned in the following description are intended solely for the sake of a description. These directional references therefore by no means suggest limitations to the positioning and the orientation of component parts of the treatment equipment 4. In addition, it should be noted that the treatment equipment 4 which will be described below is merely one exemplary embodiment of the present invention, and the present invention is not limited to any of the embodiments described herein. Therefore, other changes and modifications may be made without departing from the scope and spirit of the present invention.

Process Treatment Equipment

Figure 1:
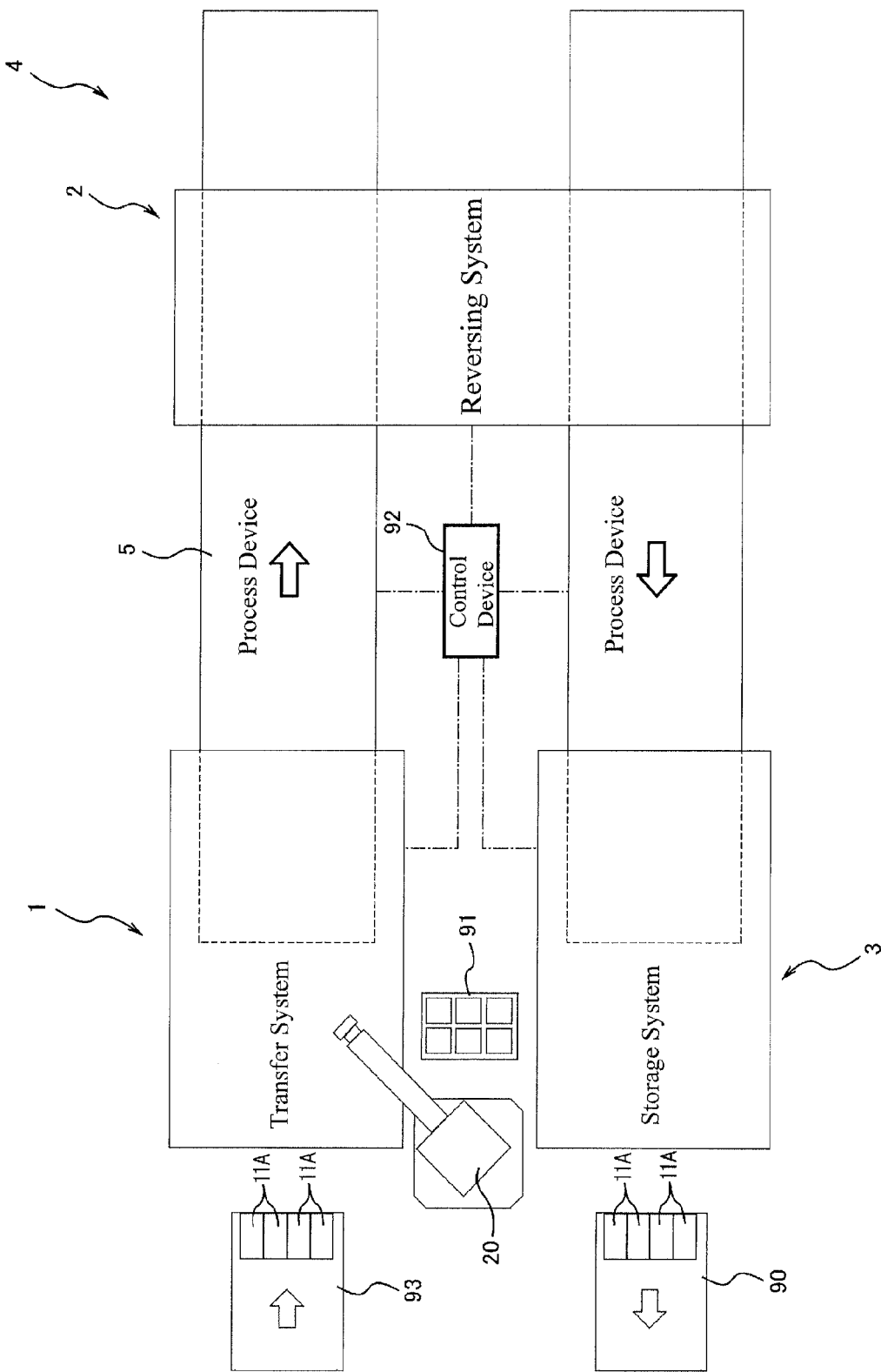
FIG. 1 is a top plan view showing the process treatment equipment equipped with a reversing system according to the present invention.

The treatment equipment 4 is an apparatus adapted to subject a plate member (e.g., a film, a glass substrate, a semiconductor wafer et cetera) to a process treatment. As it is shown in FIG. 1, the treatment equipment 4 includes a transfer system 1, a first process device 5, a reversing system 2, a second process device 6 and a storage system 3. The transfer system 1 is configured such that it transfers one by one a plurality of plate members 12 (see, for example, FIG. 2) stored in a storage cassette 11A (see, for example, FIG. 2) and places them on a first tray 13 (see FIG. 2). The first process device 5 is equipped with a first conveying mechanism 14 (see FIG. 2) such as a belt conveyor or the like. The first process device 5 is configured such that, while the first tray 13 with the plate members 12 placed thereon by the transfer system 1 is being conveyed by the first conveying mechanism 14, the obverse surface of each of the plate members 12 on the first tray 13 is subjected to a process treatment.

Figure 8:
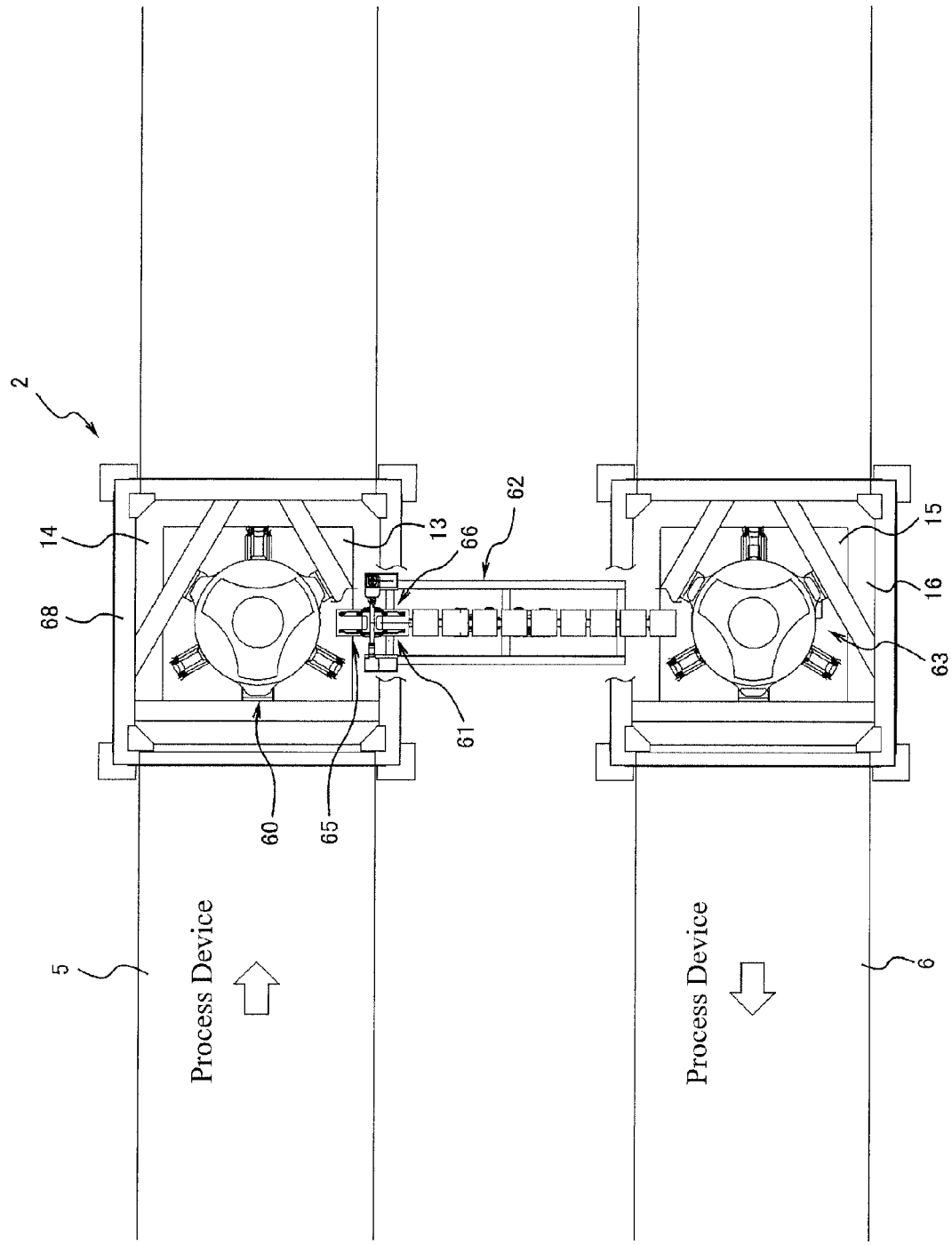
FIG. 8 is an enlarged top plan view showing, in an enlarged manner, the reversing system shown in FIG. 1.

The reversing system 2 is configured such that it takes the plate members 12, whose obverse surfaces have been treated in the first process device 5, out of the first tray 13, reverses the taken-out plate members 12 one by one so that their reverse surfaces are oriented upward and moves the reversed plate members 12 to a second tray 15 (see FIG. 8). The second process device 6 is equipped with a second conveying mechanism 16 (see FIG. 8) such as a belt conveyor and other like conveying means. The second process device 6 is configured such that, while the second tray 15 loaded with the plate members 12 from the reversing system 2 is being conveyed by the second conveying mechanism 16, it subjects the reverse surface of each of the plate members 12 on the second tray 15 to a process treatment. The storage system 3 is configured such that it transfers the plate members 12, whose reverse surfaces have undergone a process treatment in the second process device 6, one by one, and stores them in a storage cassette 11B (see FIGS. 6A, 6B).

The treatment equipment 4 equipped with the above devices and systems makes it possible that the plural plate members 12 stored in the storage cassette 11A are taken out one by one out, then subjected to a process treatment on their both surfaces and then restored one by one in the storage cassette 11B. In the following, the transfer system 1, the reversing system 2 and the storage system 3 will be described in detail in their respective configurations.

Transfer System

Figure 2:
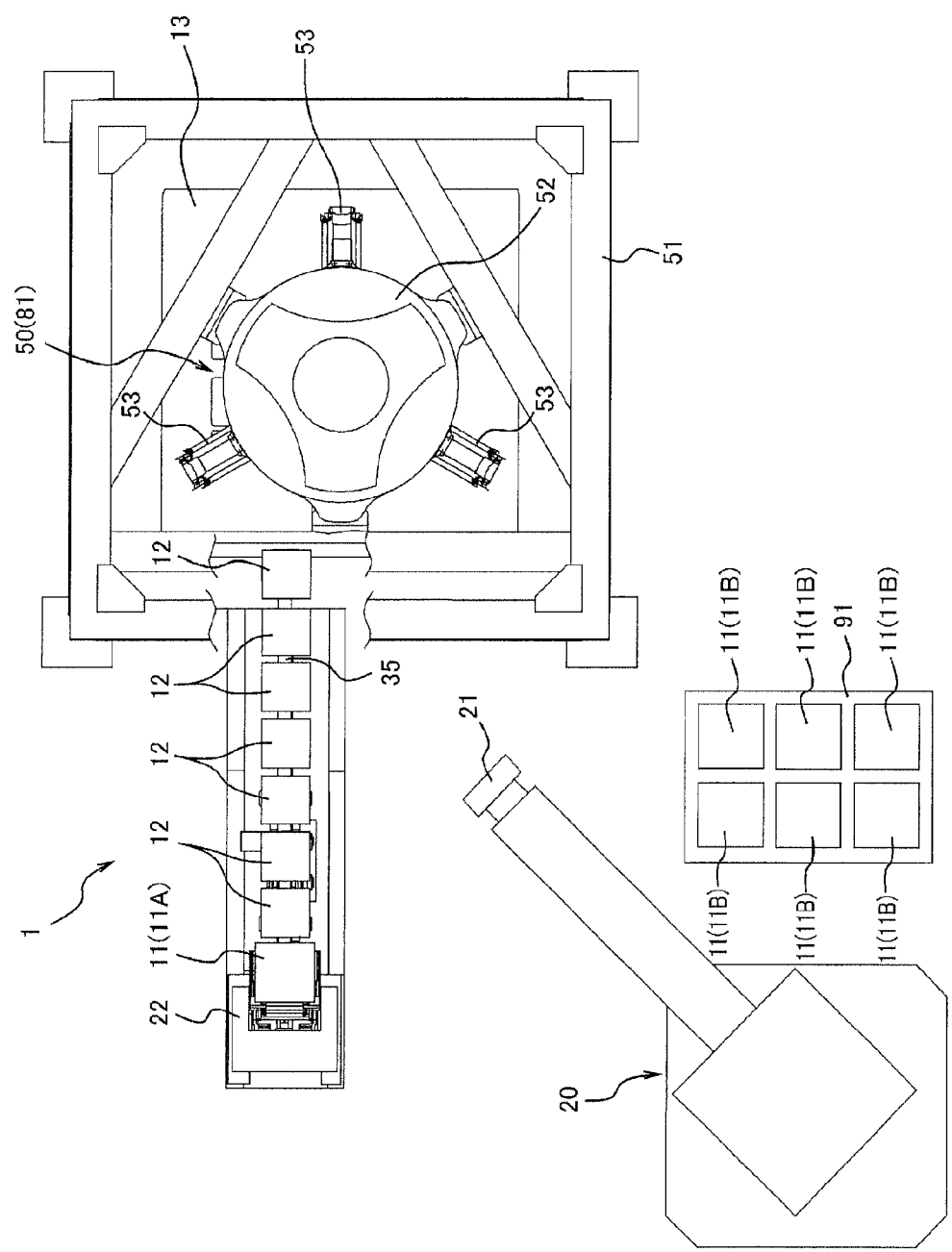
FIG. 2 is an enlarged top plan view showing in an enlarged manner a transfer system shown in FIG. 1.
Figure 3:
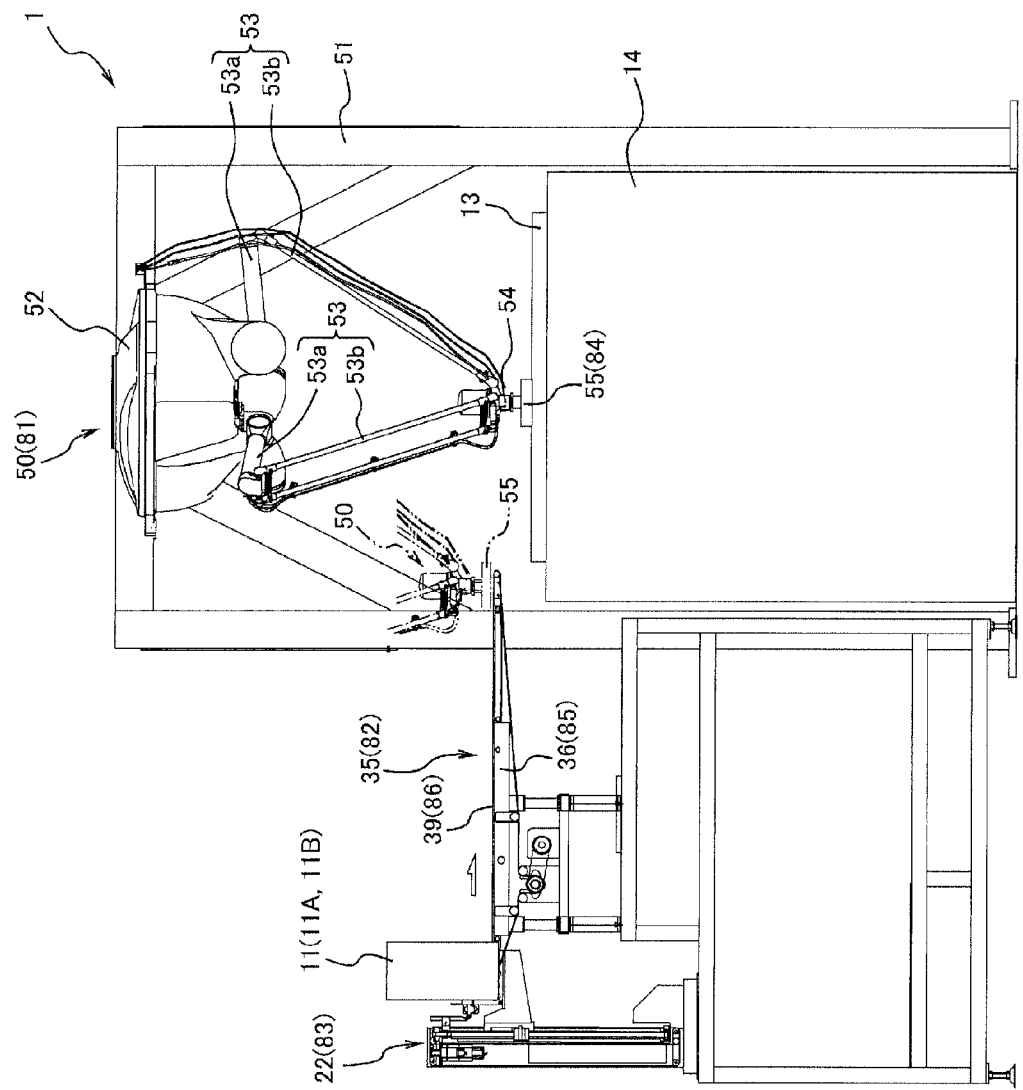
FIG. 3 is a right side view of the transfer system shown in FIG. 2, when viewed from the right side thereof.

The transfer system 1 has a transfer robot 20 (FIGS. 2, 3). The transfer robot 20 is a six-axis robot with a hand to which tip end portion a hand 21 is attached. The hand 21 is configured to hold a storage cassette 11. The transfer robot 20 moves the storage cassette 11 held by the hand 21 to mount it to an output-side up-down device 22. The storage cassette 11, which is a box body having substantially a rectangular parallelepiped shape, extends in a vertical direction in a state in which mounted to the output-side up-down device 22.

Figure 4:
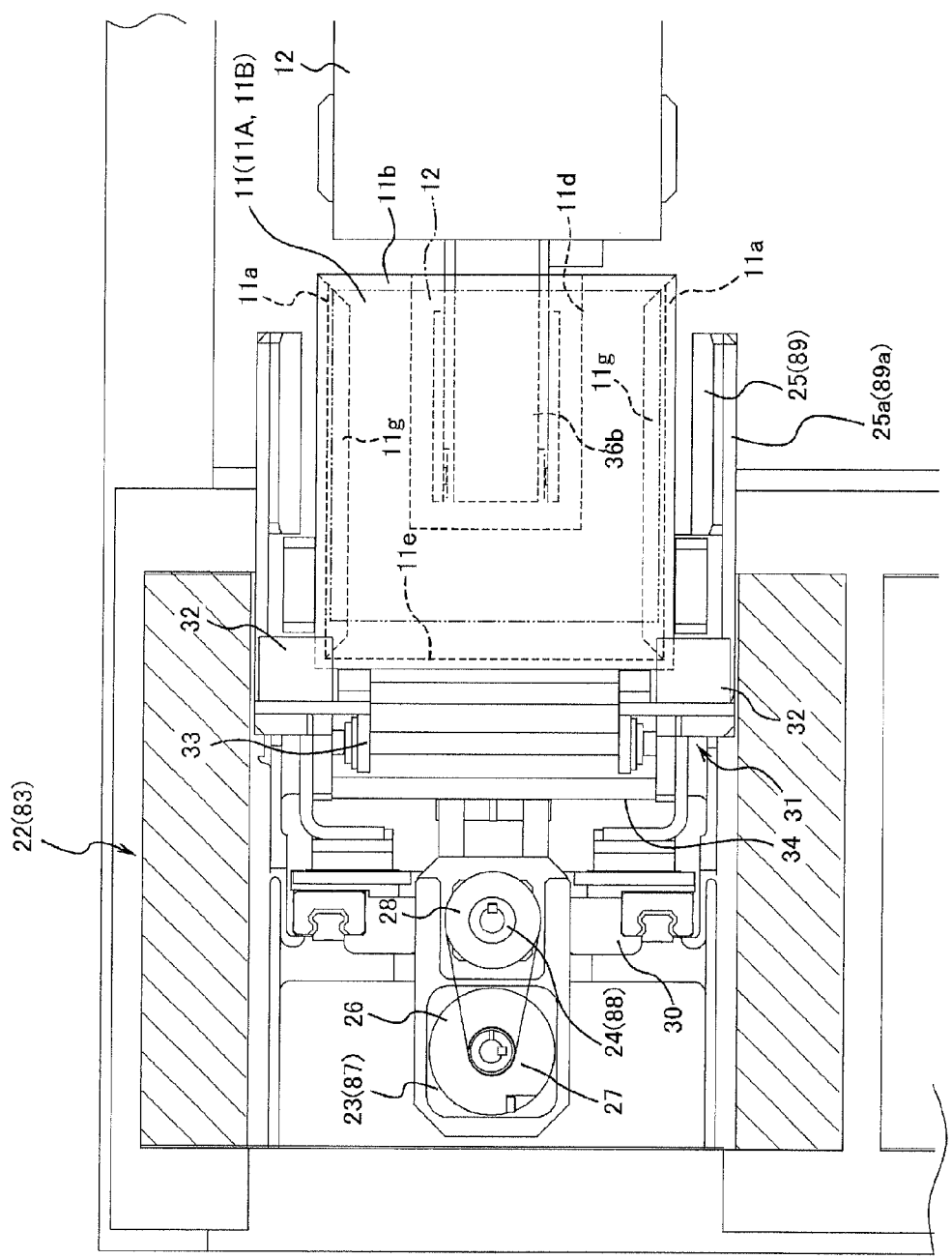
FIG. 4 is an enlarged top plan view showing in an enlarged manner an up-down device shown in FIG. 2.
Figure 5:
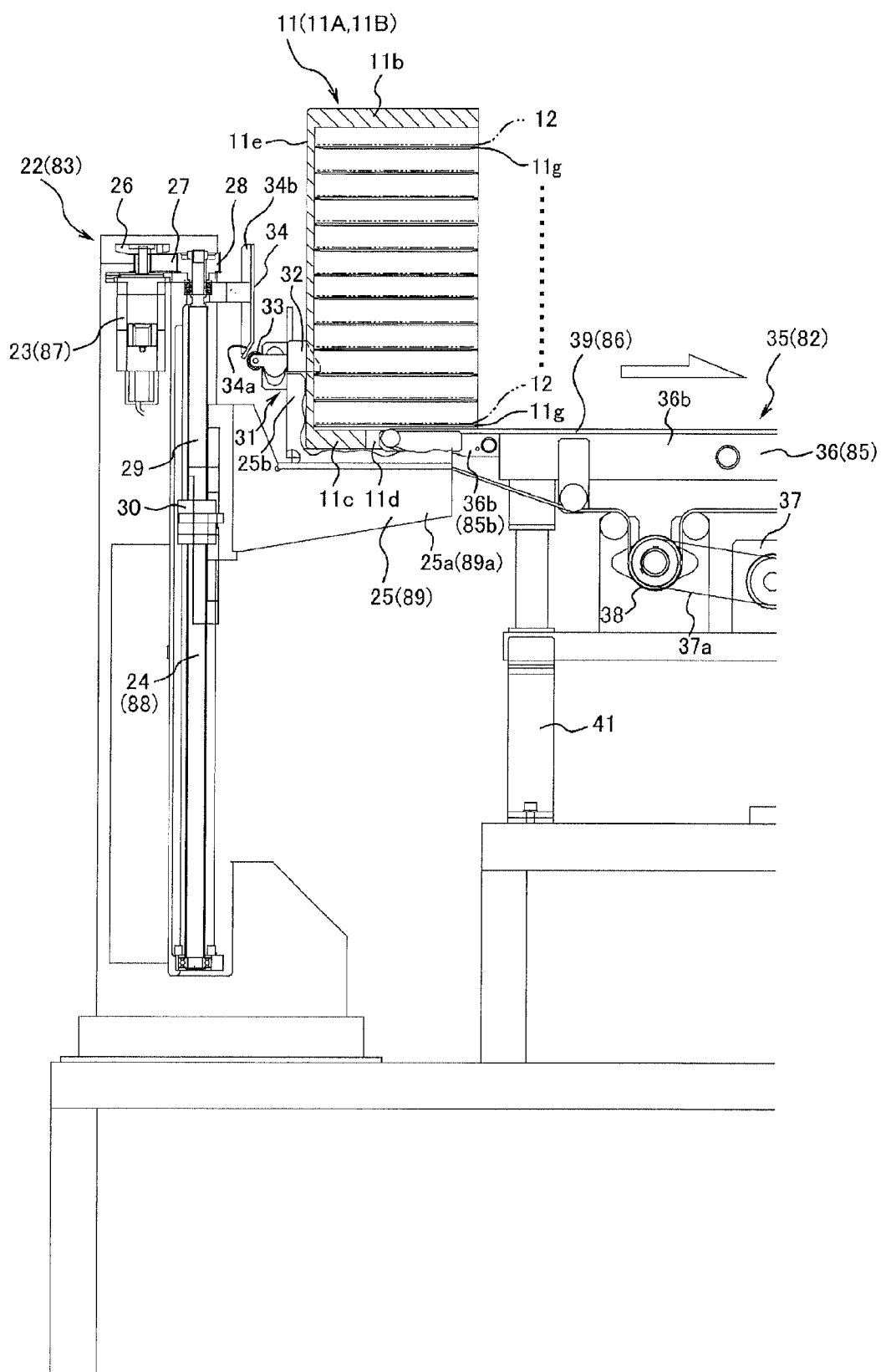
FIG. 5 is a right side view of the up-down device shown in FIG. 4, when viewed from the right side thereof.

To be more specific, the storage cassette 11 has a pair of side walls 11a, facing each other and extending in a vertical direction (FIGS. 4, 5). The pair of the side walls 11a are each provided, on their opposing surfaces (i.e., their inner peripheral surfaces), with a plurality of support sections 11g. The support sections 11g on one of the side walls 11a are positioned so as to respectively face their corresponding support sections 11g on the other side wall 11a. This allows the plate member 12 to be supported, at its both ends, in a horizontal position by two opposing support sections 11g. In addition, the support sections 11g on each of the pair of the side walls 11a are arranged such that they are spaced vertically apart at given intervals. This makes it possible for a plurality of plate members 12 to be stored in a horizontal position and arranged in a vertical direction in the storage cassette 11.

Further, the pair of the side walls 11a have, at their upper and lower ends, a top section 11b and a bottom section 11c. The bottom section 11c, which is formed into a substantially-U shape, has, in the middle thereof, an opening groove 11d. Furthermore, provided on the back of the pair of the side walls 11a (i.e., the backside of the storage cassette 11) is a back plate 11e for closing the backside of the storage cassette 11. On the other hand, the front side of the storage cassette 11 is opened, and the opening groove 11d of the bottom section 11c is open on the front side. The storage cassette 11 thus configured is attached, as described above, to the output-side up-down device 22.

The output-side up-down device 22 raises and lowers the storage cassette 11 attached thereto in a vertical direction. In the present exemplary embodiment, only one output-side up-down device 22 is provided, but a plurality of output-side up-down devices 22 may be arranged in parallel. FIGS. 4 and 5 show that the output-side up-down device 22 extends in a vertical direction. The output-side up-down device 22 has an up-down motor 23, a ball screw mechanism 24 and an up-down table 25. The up-down motor 23 is implemented by a so-called servo motor, and configured such that its angular displacement amount can be controllable, that is, its position is controllable. The output shaft of the up-down motor 23 is provided with a drive pulley 26, and by rotation of the drive pulley 26, a belt 27, which is wrapped around the drive pulley 26 in a tensioned state, drives the ball screw mechanism 24.

The ball screw mechanism 24 has a driven pulley 28, a ball screw 29 and a sliding section 30. The driven pulley 28, around which the belt 27 is wrapped in a tensioned state, is rotated by rotation of the drive pulley 26. The driven pulley 28 is attached to the rotatably supported ball screw 29, and rotates together with the ball screw 29. The sliding section 30 is attached to the ball screw 29, and moves up and down as the ball screw 29 rotates. In addition, the up-down table 25 is attached to the sliding section 30.

The up-down table 25 has a bifurcated base section 25a which is attached to the sliding section 30 and which extends forward, and a backrest section 25b which is provided at a base end portion of the base section 25a (i.e., at a rear end portion of the base section 25a) and which extends upward. The base section 25a has an upper surface which is substantially flat so that the storage cassette 11 can be placed and mounted thereon. In this case, the back plate 11e of the storage cassette 11 is disposed so as to lie along the backrest section 25b. Further, the back plate 11e has, at each of the side surfaces thereof, a respective lock piece (not shown) which extends in a lateral direction. The lock pieces are located on the side of the bottom section 11c in the back plate 11e, lying face to face with the backrest section 25b. Further, the backrest section 25b is provided with a lock mechanism 31.

The lock mechanism 31 has a pair of lock members 32 and a roller 33. The lock members 32 are provided respectively on the right and the left sides of the backrest section 25b, and their middle portions are pivotally attached to the backrest section 25b. When the lock members 32 are placed in a lock state, their front ends are positioned so as to cover the lock pieces from above. Therefore, if the lock members 32 are positioned in a lock state, this prevents the storage cassette 11 placed on the up-down table 25 from being displaced upward. On the other hand, when the lock members 32 are in an unlock state, their rear ends are pivoted so as to fall while the front ends are retracted from above the lock pieces. This allows the storage cassette 11 placed on the up-down table 25 to be attached thereto and detached therefrom.

In addition, attached to the rear ends of the lock members 32 is the roller 33, and there is provided, at a position opposite to the roller 33, a cam plate 34. The cam plate 34, which is located in an upper portion of the output-side up-down device 22, is a plate-like member extending in a vertical direction. The cam plate 34 has a lower portion 34a at a slant towards the rear, and when the roller 33 runs on the lower portion 34a, the rear ends of the lock members 32 are gradually depressed. Then, when the roller 33 runs on an upper portion 34b of the cam plate 34, the front ends of the lock members 32 are completely lifted, thereby causing the storage cassette 11 becomes unlocked. Thus, the output-side up-down device 22 is able to unlock the storage cassette 11 by movement of the up-down table 25 to its upper portion. On the other hand, when lowering the up-down table 25 from its upper portion, the rear ends of the lock members 32 are raised and thus the storage cassette 11 becomes locked. And, disposed below the up-down table 25 is a first transfer device 35.

The first transfer device 35 serving as an output-side transfer device is implemented by a so-called belt conveyor, and it transfers plate members 12 forward while suctioning them. The first transfer device 35 extends in a front-rear direction (FIGS. 6A, 6B and FIG. 7), and it comprises a base body 36, an output motor 37, a pulley 38, a conveyor belt 39 and a plurality of rollers 40. The base body 36 extends in a front-rear direction, and it is provided on a mounting 41 which is vertically disposed in a standing fashion. The base body 36 is comprised of four box-shaped sections 36a-36d which are arranged side by side in the front-rear direction.

One of the four box-shaped sections 36a-36d, i.e., a main section 36a, is disposed on the mounting 41, and connected therebehind is an up-down device-side delivery section 36b. The up-down device-side delivery section 36b is located, in plan view, between the tip end-side portions of the bifurcated base section 25a. In addition, the up-down device-side delivery section 36b is located, in plan view, between the pair of the side walls 11a of the storage cassette 11 mounted on the up-down table 25 and within an opening groove 11d of the bottom section 11c.

Further, connected in front of the main section 36a is an extension section 36c. And, mounted in front of the extension section 36c is the robot-side delivery section 36d. The robot-side delivery section 36d is attached, via cylinder mechanism 42, to the extension section 36c, and its position can finely be adjusted in the front-rear direction by the cylinder mechanism 42.

Further, the mounting 41 is provided with an output motor 37. The output motor 37 serving as a second servo motor is implemented by a so-called servo motor, and it is configured so as to control the angular displacement (i.e., control of the position). The output motor 37 is connected, through a belt 37a, to the pulley 38. Wrapped around the pulley 38 is a conveyor belt 39. The conveyor belt 39 is an endless belt, and it runs along the upper surface of the base body 36 and extends to the rear end from the front end of the upper surface of the base body 36. The conveyor belt 39 slides over the base body 36 when the output motor 37 is driven. Thus, the plate members 12 on the conveyor belt 39 are transferred forward along the base body 36, when the output motor 37 is driven. Further, the rollers 40 are provided respectively in the front end, in the rear end and in the intermediate portion of the base body 36, and the conveyor belt 39 is tensioned by the rollers 40.

The reverse surface of the conveyor belt 39 thus tensioned by the rollers 40 is in abutment with the upper side of the base body 36, and it is formed of a material of low friction. This reduces the friction between the conveyor belt 39 and the base body 36. On the other hand, the pulley 38 is provided, in its outer peripheral portion around which the conveyor belt 39 is passed, with toothlike portions for achieving increase in frictional resistance, and thus slippage between the pulley 38 and the conveyor belt 39 is suppressed. This enables drive motion imparted by the output motor 37 to be transmitted to the conveyor belt 39 without fail. As a result, the accuracy of control of the position of the plate member 12 can be improved.

Further, in the widthwise central portion of the reverse surface of the conveyor belt 39, projection pieces are formed over the entire periphery of the conveyor belt 39. Further, the four box-shaped sections 36a-36d are each provided, at their respective positions corresponding to the projection pieces of the conveyor belt 39 (i.e., the central portions of the box-shaped sections 36a-36d), with grooves, and the projection pieces are brought into fitting engagement with the grooves. This allows the box-shaped sections 36a-36d to slide over the base body 36 without considerable displacement or twisting out of the conveyor belt 39. In addition, the groove is formed to be wider than the projection piece, and the outside and the inside of the box-shaped portion 36a-36d are connected by the groove.

Furthermore, the box-shaped section 36a is provided with suction ports 43a, 43b, whereas the box-shaped sections 36b-36d are provided with suction ports 43c-43d, respectively. Connected to these suction ports 43a, 43b is a suction device (not shown) such as a pump or the like. In addition, in the main section 36a, there is provided a separating wall 44 so that the inside of the main section 36a is divided into two regions, i.e., a front region 44a and a rear region 44b. And, the suction ports 43a, 43b are connected to these two regions 44a, 44b, respectively. In addition, there are formed, in the conveyor belt 39, a plurality of intake apertures 39a. The conveyor belt 39 constitutes, together with the base body 36 and a suction device (not shown), a suction mechanism 45. The suction mechanism 45 is operable to suction the plate member 12 on the conveyor belt 39. The intake apertures 39a are arranged in two rows in the width direction of the conveyor belt 39 and they are formed over the entire periphery. Additionally, it is preferred that the intake apertures 39a be arranged such that all of them are hidden by the plate members 12 on the conveyor belt 39.

In addition, the suction ports 43a-43e are separately switchable between a suction-on state and a suction-off state, and thus the box-shaped sections 36a-36d and the regions 44a, 44b are separately switchable in their pressure state. The conveyor belt 39 is divided into regions (more specifically, five regions) according to the four box-shaped sections 36a-36d and the two regions 44a, 44b on the base body 36, and thus the regions thus divided are independently switchable between suction-on state and suction-off state. This enables the first transfer device 35 to release suction of the robot-side delivery section 36d of the base body 36, while simultaneously maintaining suctioning of other than the robot-side delivery section 36d. Disposed in a first transfer completed position overlying the robot-side delivery section 36d whose suction can be released in the way as described above is a first delta robot 50.

The first delta robot 50 serving as a transfer/placing robot is disposed in the top portion of a frame 51 (FIGS. 2, 3), and it has a main body 52, three arm mechanisms 53, a mounting section 54 and a suction hand 55. The main body 52 is fastened, at its upper part, to the top portion of the frame 51, under which attached are the three arm mechanisms 53 arranged at equal intervals in a circumferential direction. These three arm mechanisms 53 have the same configuration, and therefore in the following, a description will be given in regard to only one of the arm mechanisms 53 and the description of the rest is omitted accordingly.

The arm mechanism 53 has a first arm section 53a and a second arm section 53b. The first arm section 53a is pivotally attached to a lower part of the main body 52, and it extends in a substantially horizontal direction so as to be apart from the main body 52. The second arm section 53b is pivotally attached to the tip end of the first arm section 53a, and it is formed of a parallel link, and extends downward. And, the second arm section 53b of each of the arm mechanisms 53 is connected, at its lower end, to the single mounting section 54. The arm mechanism 53 is configured such the joint portion pivotally attached is moved by a drive motor, i.e., a servo motor, (not shown), and thus the mounting section 54 can be moved in a vertical, a right-left (lateral) or a front-rear (longitudinal) direction while being kept in a horizontal position (for example, see two-dot chain line in FIG. 3). In addition, the suction hand 55 is attached to the mounting section 54.

The suction hand 55 is a suction hand of the Bernoulli method. Thereby, plate member 12 can be sucked to the bottom surface of the suction hand 55. The suction hand 55 has a hand main body and four guides (not shown). The hand main body is formed into substantially a rectangular parallelepiped shape, and it has an outer diameter dimension slightly smaller than the plate member 12 in plan view. The hand main body is configured such that, with its upper part attached to the mounting section 54, the plate member 12 is sucked to the bottom surface. In addition, the four guides are arranged on the four side surfaces of the hand main body, respectively. Each guide extends so as to project downward from the bottom surface of the hand main body, and it is able to move backward and forward in a horizontal direction relative to the hand main body. By bringing the guides together towards the hand main body, the plate member 12 is moved near to the center of the suction hand 55 for positioning thereof.

Disposed below the first delta robot 50 thus configured is the first tray 13, and the plate members 12 transferred by the first transfer device 35 are placed onto the first tray 13. The first tray 13 has a plurality of zones divided and arranged according to the shape of the plate member 12, thereby allowing for placing a single plate member 12 on each zone. The first tray 13 is placed on the first conveying mechanism 14, and the first conveying mechanism 14 is configured such that the first tray 13 is conveyed through the treatment chamber of the first process device 5 (not shown) to the reversing system 2.

Reversing System

Figure 9:
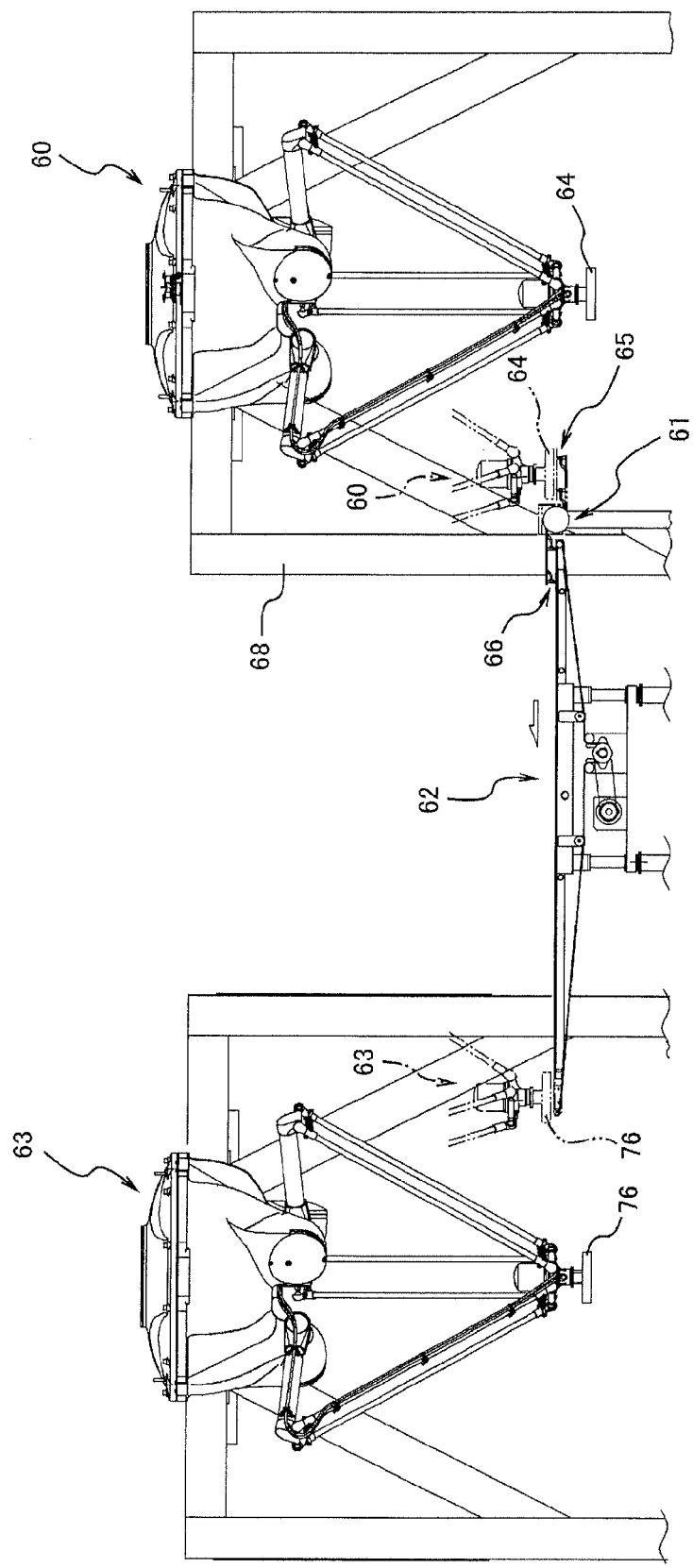
FIG. 9 is a rear view of the reversing system shown in FIG. 8, when viewed from the rear side thereof.

The reversing system 2 extends in a direction orthogonal to the first process device that extends in a longitudinal direction, that is, the reversing system 2 extends in a lateral direction. And as shown in FIGS. 8, 9, the reversing system 2 includes a second delta robot 60, a reversing device 61, a second transfer device 62 and a third delta robot 63. The second delta robot 60, which serves as an upstream-side transfer/placing robot, has the same configuration as the first delta robot 50 of the transfer system 1, and in regard to the description of its configuration, the description of the first delta robot 50 should be referred to and a part of the description of its structure or the like is omitted. The second delta robot 60 is configured such that the suction hand 64 at the lower end thereof holds the plate member 12 by application of suction force. More specifically, the second delta robot 60 is located in front of the exit of the first process device 5, and it is adapted so as to hold, by suctioning, the plate member 12 on the first tray 13 on the first conveying mechanism 14. In addition, the reversing device 61 is disposed so as to lie adjacent to the second delta robot 60.

The reversing device 61 is configured such that it reverses the upper and the lower surfaces of the plate member 12 transferred and placed in a first transfer/placing area 65 and then moves it towards a second transfer/placing area 66. The reversing device 61 is disposed on a base 67. In addition, the reversing device 61 is positioned in the inside of a frame 68 in which the second delta robot 60 is disposed. The reversing device 61 receives from the second delta robot 60 the plate member 12 held by suctioning.

Figure 10:
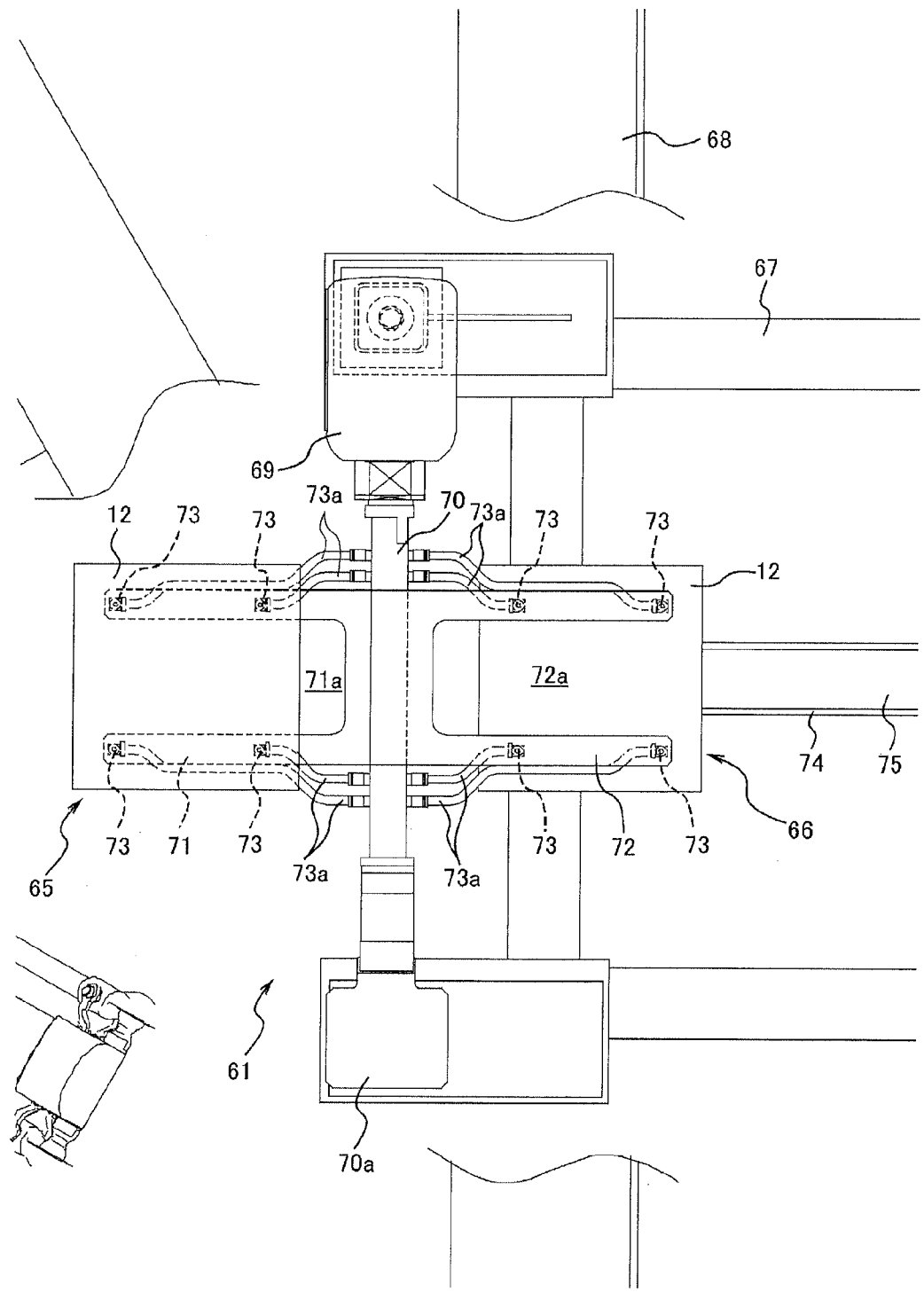
FIG. 10 is an enlarged top plan view showing, in an enlarged manner, the reversing system shown in FIG. 8.
Figure 11:
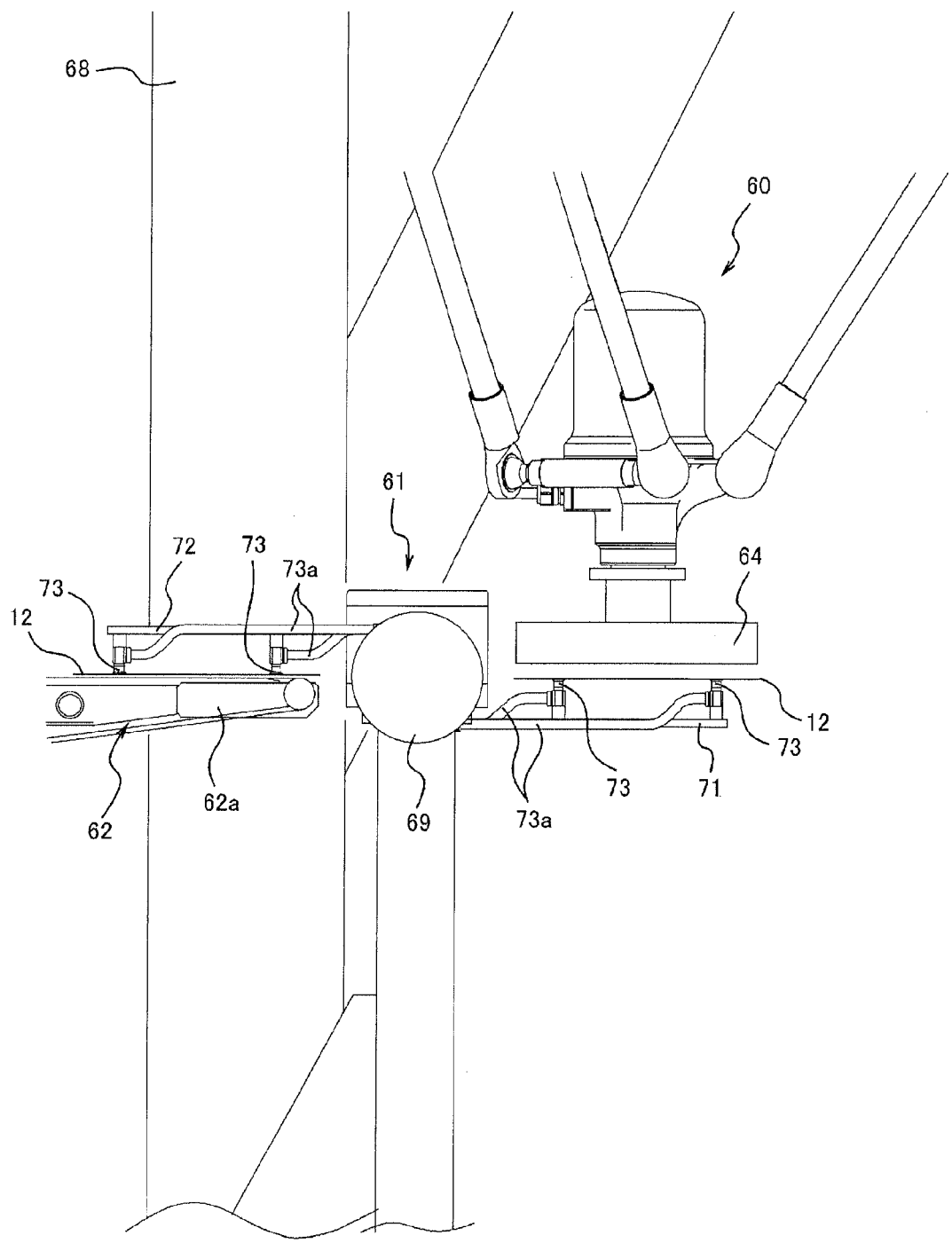
FIG. 11 is a rear view of the reversing system shown in FIG. 10, when viewed from the rear side thereof.

As it is shown in FIGS. 10 and 11, the reversing device 61 is equipped with a reversing motor 69, a reversing shaft 70, a pair of reversing tables 71, 72 and a plurality of suction pads 73. The reversing motor 69, which is implemented by a so-called servo motor, is attached to the base 67. The reversing motor 69 has, as an output shaft thereof, the reversing shaft 70. The reversing shaft 70 is rotated by the reversing motor 69. The reversing shaft 70 is a shaft member extending in a longitudinal direction, and its tip end is rotatably supported by a bearing member 70a. Further, attached in the middle of the reversing shaft 70 are the pair of the reversing tables 71, 72.

The pair of the reversing tables 71, 72 are firmly secured to the outer peripheral part of the reversing shaft 70, and they are disposed at respective positions axially symmetric with each other relative to the axis of the reversing shaft 70. That is, the reversing tables 71, 72 extend from the reversing shaft 70 in opposite directions. In other words, the reversing table 71 extends from the reversing shaft 70 at the second delta robot 60 side, whereas the reversing table 72 extends in a direction opposite to the direction in which the reversing table 71 extends. Further, the reversing table 71, 72 is formed into a substantially U-shape. More specifically, the portion of each reversing table 71, 72, located ahead, relative to the tip end, of the base end attached to the reversing shaft 70, is bifurcated into two parts so as to form a substantially a U-shape in the middle of which is defined a space 71a, 72a. In addition, disposed on the tip end-side of each reversing table 71, 72 are a plurality of suction pads 73 (four suction pads in the present embodiment).

The suction pads 73 are connected, through respective tubes 73a, to a suction device (not shown), and when the suction device is actuated, this suctions the reverse surface of the plate member 12 on the suction pads 73 so that the plate member 12 is held against the suction pads 73. The suction pads 73 are mounted such that they are oriented in the same direction of the reversing table 72 in a circumferential direction around the reversing shaft 79. That is, in the reversing table 71, its suction pads 73 are mounted on the upper surface thereof, while, in the reversing table 72, its suction pads 73 are mounted on the lower surface thereof. That is, whenever the reversing table 71, 72 is in a receiving position, the suction pads 73 are always oriented in an upward direction while, whenever the reversing table 71, 72 is in a delivery state, the suction pads 73 are always oriented in a downward direction.

What is meant here by the "receiving position" is such a position that the reversing table 71 is in a horizontal position and extends on the second delta robot 60 side (see the reversing table 71 in FIGS. 10, 11). On the other hand, what is meant here by the "delivery position" is such a position that the reversing table 72 is in a horizontal position and extends via the reversing shaft 70 on the side opposite to the second delta robot 60 (see the reversing table 72 in FIGS. 10, 11). And, the region overlying the reversing table 71 when it is in the receiving position is the first transfer/placing area 65, and the region underlying the reversing table 72 when it is in the delivery position is the second transfer/placing area 66. And, the second transfer device 62 is situated in the second transfer/placing area 66.

The second transfer device 62 has substantially the same configuration as that of the first transfer device 35 of the transfer system 1, and therefore as to its configuration, the difference from the first transfer device 35 will be described mainly. On the other hand, as to the same configuration, the first transfer device 35 should be referred to and the description thereof is omitted accordingly. The second transfer device 62 receives at the second transfer/placing area 66 the plate member 12 reversed by the reversing device 61 and then transfers the received plate member 12 to the third delta robot 63 while holding it by suctioning.

Figure 12:
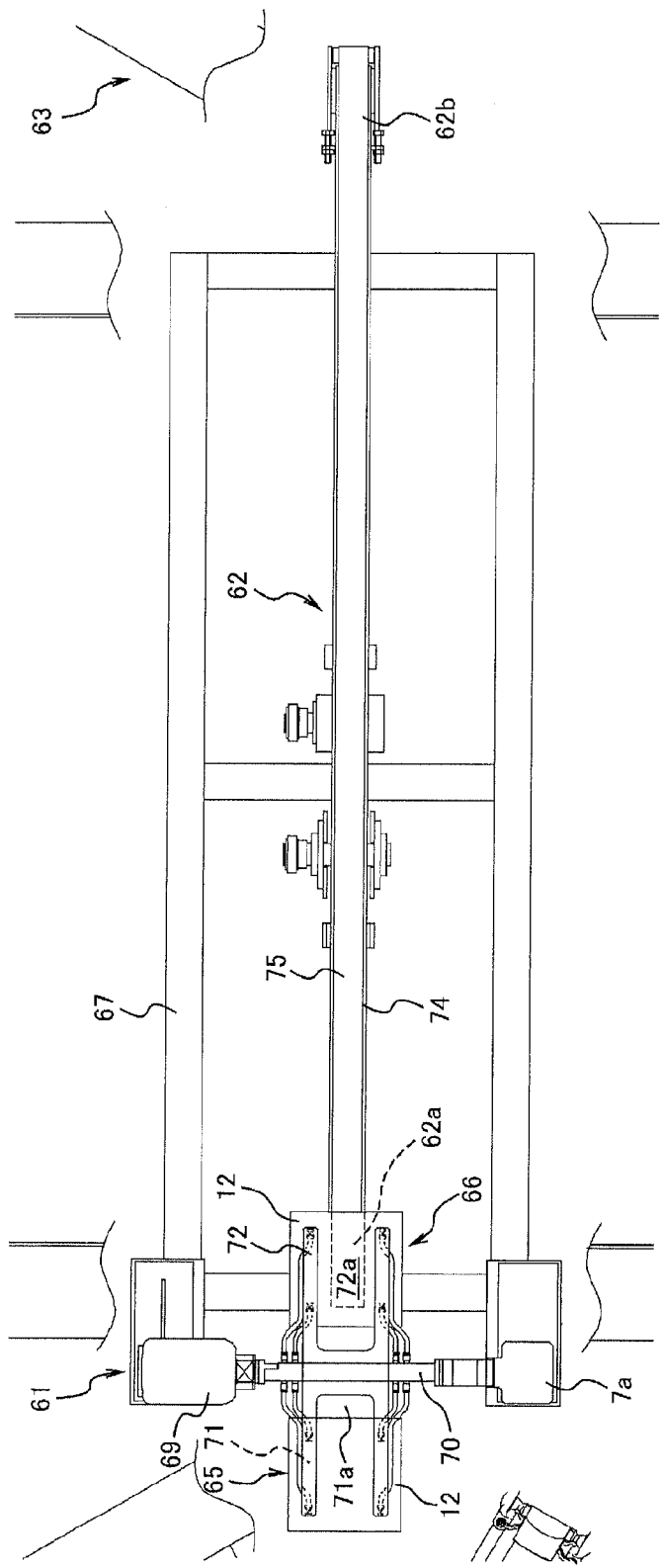
FIG. 12 is an enlarged top plan view showing, in an enlarged manner, a second transfer device shown in FIG. 8.
Figure 13:
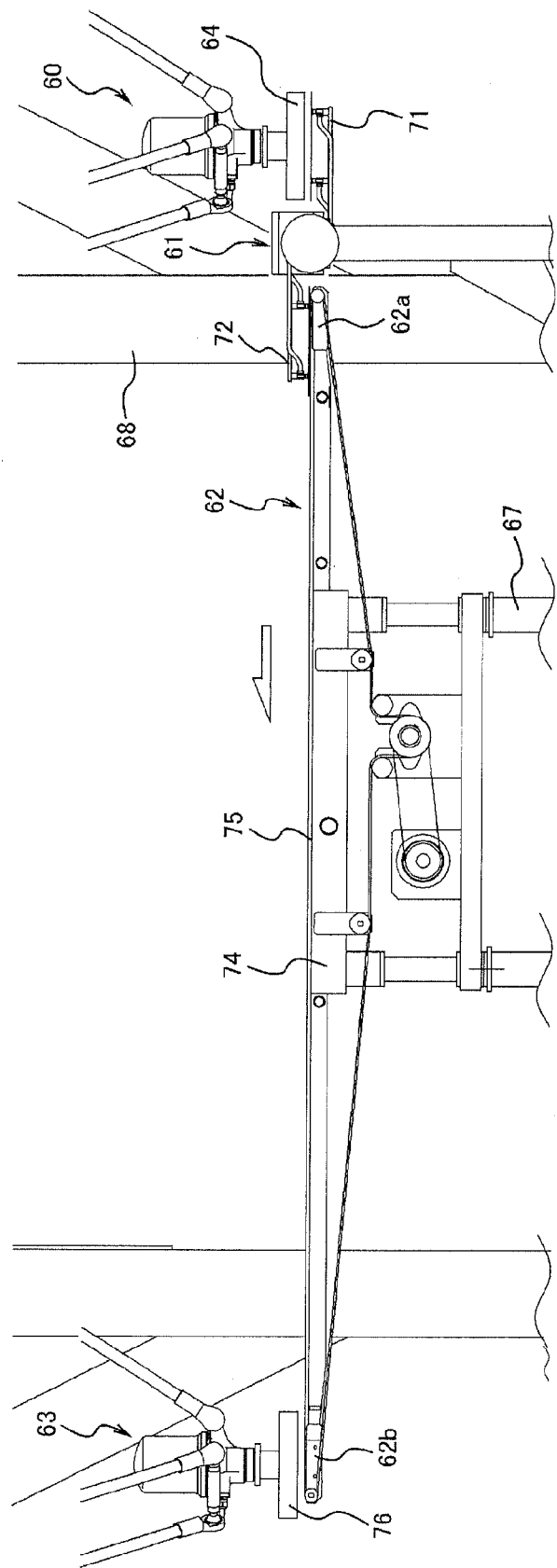
FIG. 13 is a rear view of the second transfer device shown in FIG. 12, when viewed from the rear side thereof.
Figure 14:
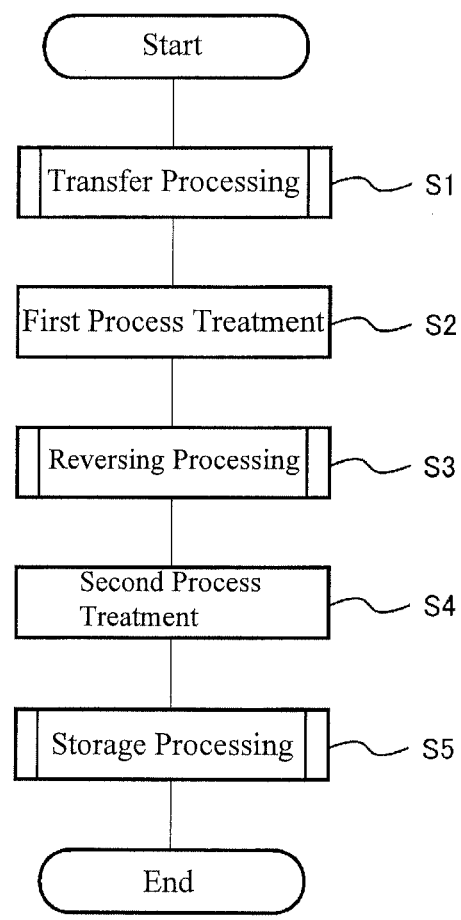
FIG. 14 is a flow chart showing an equipment-treatment procedure to be executed in the treatment equipment.
Figure 15:
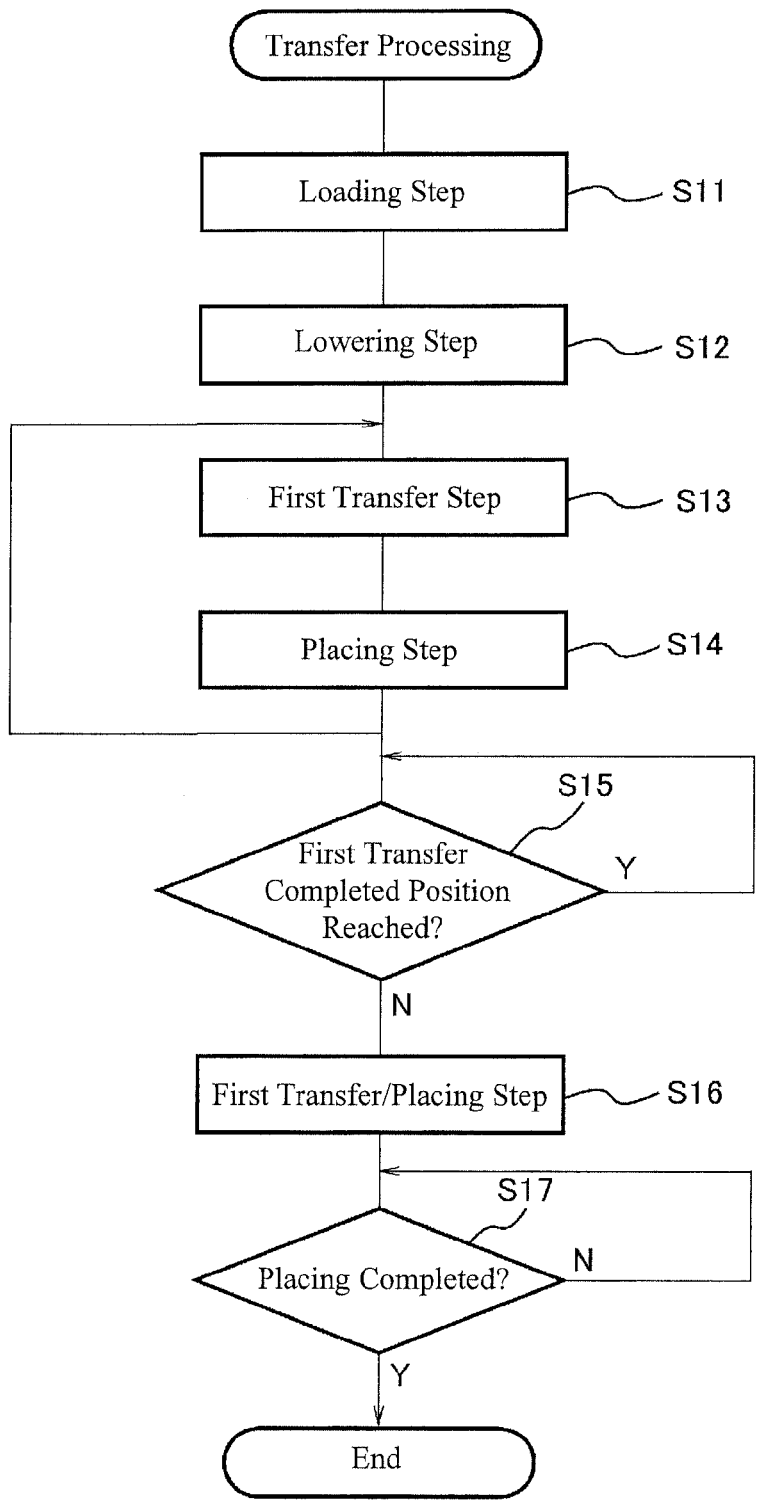
FIG. 15 is a flow chart showing a transfer-processing procedure to be executed in the transfer system.

As it is shown in FIGS. 11 and 12, the second transfer device 62 is mounted on the base 67, and it extends laterally so as to be bridged between the second delta robot 60 and the third delta robot 63. The second transfer device 62 is adapted to receive, at its one end 62a (the end on the side of the second delta robot 60), the plate member 12 from the reversing device 61. The one end 62a of the second transfer device 62 is adapted to be fit within the space 71a, 72a of the reversing table 71, 72 of the reversing device 61 in planar view. This allows the reversing device 61 to make one turn without abutment against the second transfer device 62. In addition, the second transfer device 62 has a base 74, and the base 74 is provided with a conveyor belt 75. The conveyor belt 75 slides along the base 74. When the conveyor belt 75 is driven, the plate member 12 is conveyed to the second transfer completed position of the other end 62b (the end on the side of the third delta robot 63). In addition, the reversing device 61 constitutes, together with the base 74, the conveyor belt 75 and the suction device (not shown), a suction mechanism 77, to suction and hold the lower surface of the plate member 12 on the conveyor belt 74. In addition, the third delta robot 63 is situated at the second transfer completed position.

The third delta robot 63, which serves as a downstream-side transfer/placing robot, has substantially the same configuration as that of the first delta robot 50 of the first transfer system 1, and therefore as to its configuration, the description of the first delta robot 50 should be referred to and the description of its structure or the like is partially omitted. The third delta robot 63 has, at its lower end, a suction hand 76 by which to hold, by suctioning, the plate member 12 situated at the second transfer completed position. In addition, located under the third delta robot 63 is the second conveying mechanism 16. And the second tray 15 is placed on the second conveying mechanism 16. And, the third delta robot 63 places, the plate members 12 held by suctioning, one by one onto the second tray 15 on the second conveying mechanism 16. The second conveying mechanism 16 conveys the second tray 15 to the storage system 3 via the treatment chamber (not shown) of the second process device 6.

Storage System

The storage system 3 has substantially the same configuration as that of the first transfer system 1, and therefore as to its configuration, the description of the transfer system 1 should be referred to, and the description of its structure or the like is partially omitted accordingly. The storage system 3 is configured so that the plate members 12, which have undergone a process treatment in the second process device 6, are arranged one by one in a vertically direction and then are stored into the storage cassette 11. Hereinafter, a specific configuration of the storage system 3 will be described with reference to FIGS. 2 through 7. The storage system 3 shares the transfer system 1 with the transfer robot 20, and it further includes a fourth delta robot 81, a third transfer device 82 and a storage-side up-down device 83.

The fourth delta robot 81 serving as a transfer/placing robot has substantially the same configuration as that of the first delta robot 50. The fourth delta robot 81 is located above the terminal position of the second conveying mechanism 16, and its suction hand 84 attached to the lower end of the fourth delta robot 81 suction and holds the plate member 12 placed on the second tray 15. And, the fourth delta robot 81 transfers and places onto the third transfer device 82 the plate member 12 held by suctioning.

Figure 6A:
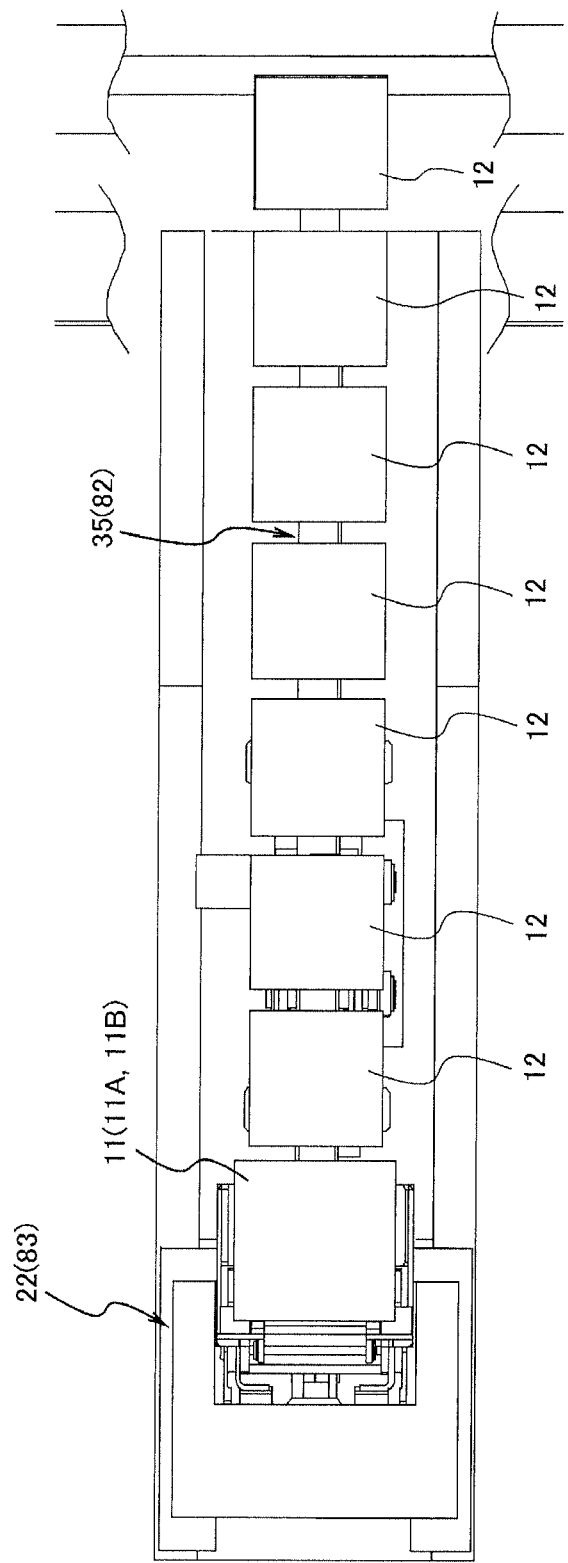
FIG. 6A is an enlarged top plan view showing, in an enlarged manner, a state in which plate members are transferred by a first transfer device shown in FIG. 2.
Figure 6B:
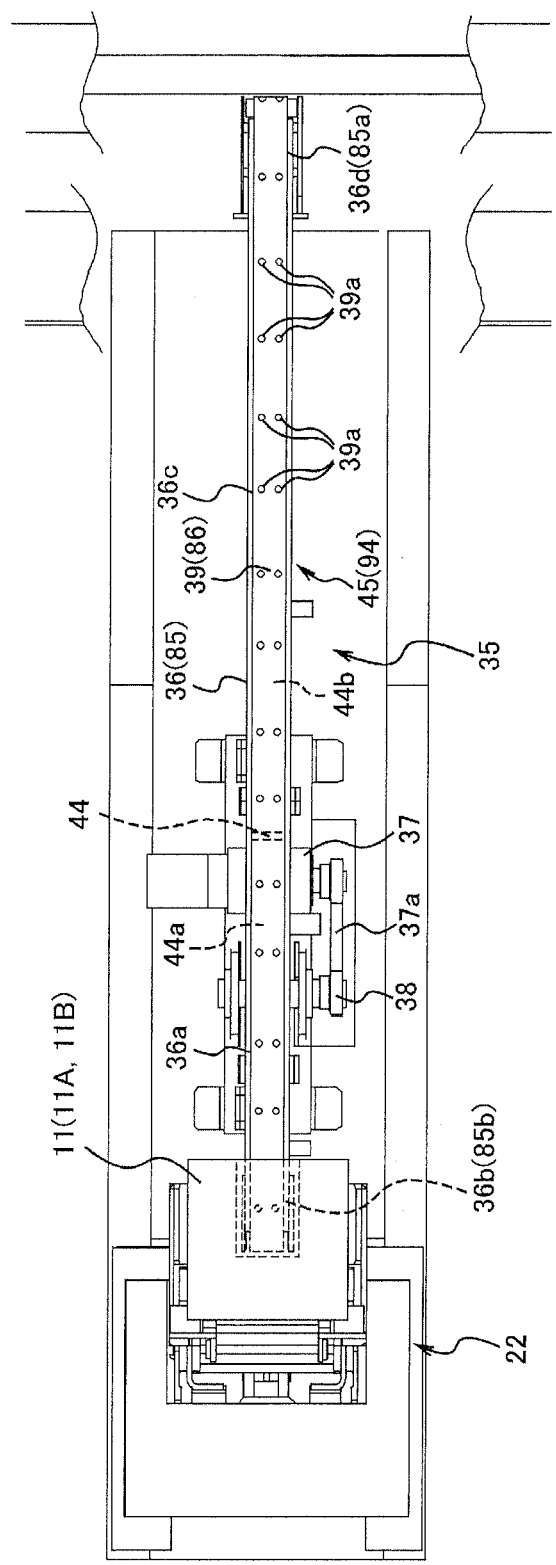
FIG. 6B shows a state of the first transfer device shown in FIG. 6A, with the plate members removed therefrom.
Figure 7:
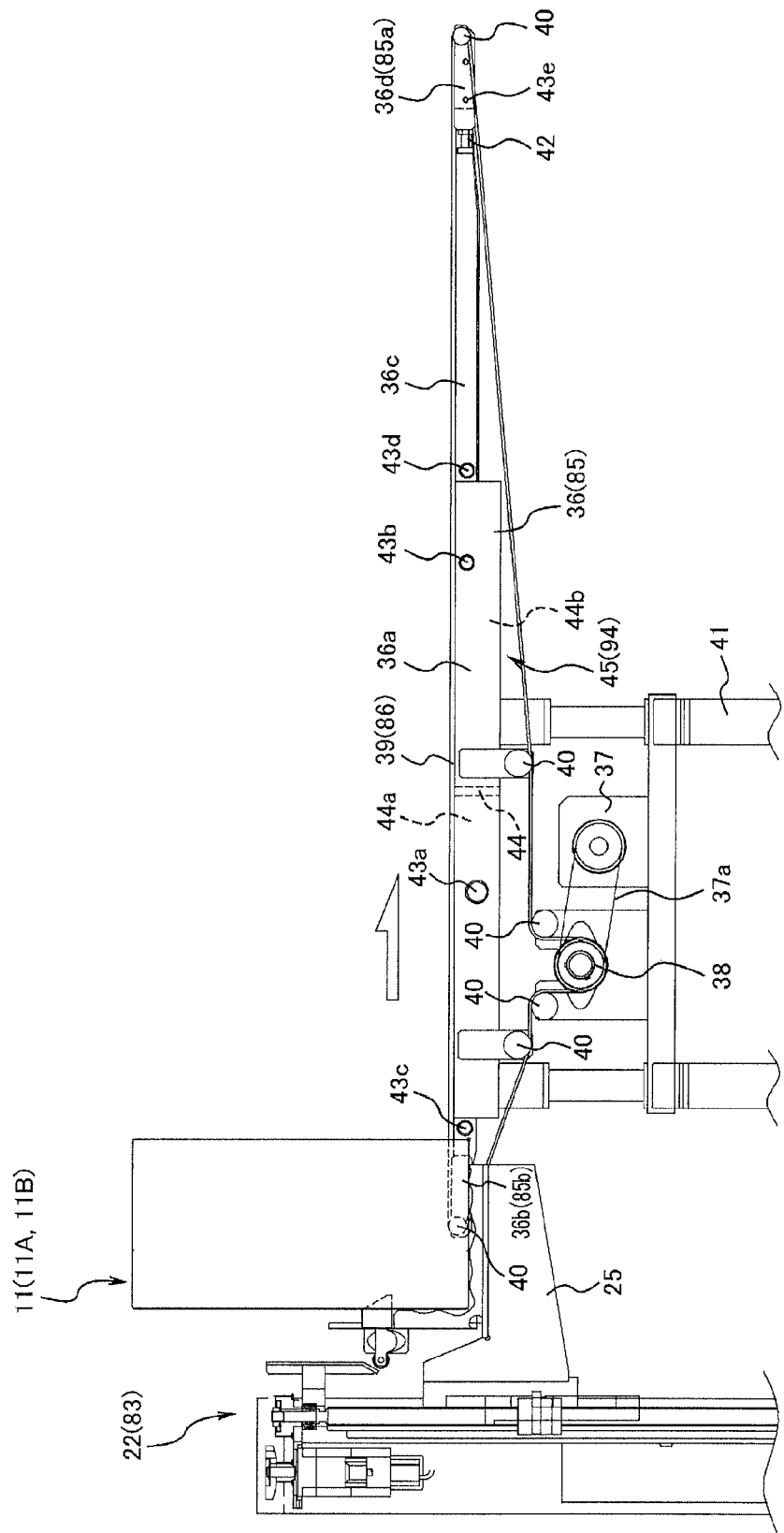
FIG. 7 is a right side view of the first transfer system shown in FIG. 6B, when viewed from the right side thereof.

The third transfer device 82 serving as a storage-side transfer device has substantially the same configuration as that of the first transfer device 35. As it is shown in FIGS. 6A, 6B and FIG. 7, the third transfer device 82 receives, at its one end which is the end of the fourth delta robot 81 side (i.e., a robot-side delivery section 85a of the base 85), the plate member 12 from the fourth delta robot 81. The third transfer device 82, moves the plate member 12, which is received by the conveyor belt 86 disposed in the base 85 and sliding therealong, by the conveyor belt 86 to a transfer completed position at the other end (i.e., an up-down device-side delivery section 85b of the base 85). In addition, the third transfer device 82 holds by application of suction the plate member 12 from the side of the conveyor belt 86 at the time of transfer, to prevent the plate member 12 from falling off from the conveyor belt 86. Besides, the storage-side up-down device 83 is disposed in the transfer completed position.

The storage-side up-down device 83 has substantially the same configuration as that of the output-side up-down device 22. As it is shown in FIGS. 4 and 5, the storage-side up-down device 83 is configured so that the up-down table 89 can be vertically movable by an up-down motor 87 and a ball screw 88. In the up-down table 89, its base section 89a has bifurcated portions on the tip end side, and the up-down table 89 is disposed such that the up-down device-side delivery section 85b lies between the bifurcated tip end side portions. In addition, the base section 89a is configured so that it allows for placing and mounting of the storage cassette 11 thereon, and the storage cassette 11 thus mounted is configured such that the up-down device-side delivery section 85b is positioned, in planar view, in the opening groove 11d of the storage cassette 11.

The storage cassette 11 is adapted such that it becomes unlocked by upward movement of the up-down table 89, and thus the storage cassette 11 can be detached from the up-down table 89 by the transfer robot 20. The transfer robot 20 conveys the storage cassette 11 detached from the up-down table 89 to a carrying-out table 90. In addition, the transfer robot 20 removes the storage cassette 11, from which all of the plate members 12 have been carried out by the transfer system 1, from the output-side up-down device 22 of the transfer system 1. Then, the transfer robot 20 transfers the removed storage cassette 11 to a standby table 91. The storage cassette 11 transferred onto the standby table 91 is placed onto the up-down table 89 by the transfer robot 20. In the following, it should be noted that the storage cassette 11 in which untreated plate members 12 are stored may be referred to as a storage cassette 11A while on the other hand the storage cassette 11 in which no untreated plate members 12 are stored or the storage cassette 11 in which treated plate members 12 are stored is referred to as a storage cassette 11B.

The treatment equipment 4 thus configured is equipped with a control device 92, as shown in FIG. 1. The control device 92 controls the operation of each of the devices of the systems 1, 2, 3, and by such control on the operation of each device, the plate members 12 are subjected to a process treatment on their obverse and reverse surfaces. Hereinafter, with reference to FIGS. 14 to 20, a description will be given in regard to the operation of each device to be controlled by the control device 92.

Operation of Treatment Equipment

In the treatment equipment 4, the transfer system 1, the first process device 5, the reversing system 2, the second process device 6 and the storage system 3 are in simultaneous operation, and a plurality of plate members 12 are sequentially delivered and continuously subjected to a treatment. In the following, with reference to a flow chart of FIG. 14, the operation of each of the systems 1, 2, 3 and the operation of each of the devices 5, 6 in the treatment equipment 4 will be described along the flow of the process of treatment of the plate member 12. In the treatment equipment 4, all of the following operations are controlled by the control device 92, and after a carrying-in table 93 on which a plurality of storage cassettes 11A are placed is carried in, the process treatment starts. Upon start of the process treatment, the treatment process flow moves to step S1.

Transfer Processing

Step S1 is a transfer processing step in which each of the devices of the transfer system 1 is controlled by the control device 92 so that a plurality of plate members 12 stored in a storage cassette 11A are taken out one by one and then arrayed on the first tray 13. Hereinafter, the transfer processing will be described in detail with reference to FIGS. 15, 16.

Upon start of the transfer processing, the treatment process flow first moves to step S11. Step S11 is a loading step in which the control device 92 operates the transfer robot 20 so that any one of the storage cassettes 11A placed on the carrying-in table 93 is held by the hand 21. Thereafter, the control device 92 moves the storage cassette 11A held by the transfer robot 20 to the up-down table 25 in an unlocked and unloaded state and places it thereon. In the way as described above, the storage cassette 11A is loaded on the up-down table 25. Subsequently, the control device 92 causes the hand 21 to stop holding the storage cassette 11A. When holding of the storage cassette 11A by the hand 21 is released, the treatment process flow moves to step S12.

Step S12 is a lowering step in which the control device 92 operates the output-side up-down device 22 so that the up-down table 25 loaded with the storage cassette 11A descends. To be more specific, the control device 92 actuates the up-down motor 23 to cause the ball screw mechanism 24 to be rotated in a specified direction via the drive pulley 26, the belt 27 and the driven pulley 28. As a result of this, the sliding section 30 moves downward, and the up-down table 25 descends. Upon descent of the up-down table 25, the roller 33 of the lock mechanism 31 is eventually detached from the cam plate 34, and the lock member 32 pivots to enter into a lock state. This locks the storage cassette 11A to the up-down table 25.

As the up-down table 25 is further moved downward, the up-down device-side delivery section 36b enters between the bifurcated tip end-side portions of the up-down table 25 and eventually it also enters the opening groove 11d of the storage cassette 11A. As a result of this, the lowest of the plate members 12 in the storage cassette 11A lies on the up-down device-side delivery section 36b, i.e., in the placement position of the first transfer device 35. When placed, the treatment process flow moves to step S13.

Step S13 is a first transfer step in which the control device 92 operates the first transfer device 35 so that the plate member 12 placed in the placement position is transferred in the direction of the first delta robot 50, i.e., towards the first transfer completed position. To be more specific, the control device 92 actuates the output motor 37, causing the pulley 38 to be rotated via the belt 37a so that the conveyor belt 39 is turned around. The plate member 12 in the placement position lies on the conveyor belt 39, and is transferred in the direction of the first transfer completed position as the conveyor belt 39 is turned around.

In addition, during transfer of the plate member 12, the control device 92 actuates the suction device, so that in the box-shaped sections 36a-d is drawn in through the suction ports 43a-e. Consequently, the intake apertures 39a become negative in pressure, causing the plate member 12 to be sucked to the conveyor belt 39 by the intake apertures 39a. The suction mechanism 45 operates such that it sucks the plate member 12 upon placement in the placement position while it stops suctioning when the plate member 12 is transferred to the first transfer completed position. In the manner as described above, the plate member 12 is transferred while being held by application of suction force, and thus the plate member 12 can be transferred at high speed while it remains in the same position as that when placed in the placement position. This allows for increase in transfer speed, and thus the plate member 12 can be transferred from the placement position to the transfer completed position in short time. In addition, the accuracy of arrival position of the plate member 12 in the transfer completed position can be improved. When the placement position becomes empty after the plate member 12 in a suction-held state is transferred in the direction of the first transfer completed position for a predetermined length of time, the treatment process flow moves to step S14. In addition, even after the treatment process flow moves to step S14, the control device 92 still drives the output motor 37, and when the plate member 12 is transferred for a predetermined distance from the placement position (for example, for a distance corresponding to the length of the plate member 12), the control device 92 stops the output motor 37. That is, step S14 is performed in an overlapping manner with a part of the transfer operation of the first transfer device 35.

Step 14 is a placing step in which the control device 92 operates the output-side up-down device 22 so that the up-down table 25 is moved downward just for a height corresponding to a predetermined distance for which the support sections 11g are separated vertically apart from each other. When the up-down table 89 is moved downward, the next plate member 12 is placed in the placement position, and the plate member 12 is moved away from the support sections 11g. Thereafter, the control device 92 stops the output-side up-down device 22, but before that, the treatment process flow returns to step S13 in which the control device 92 operates the first transfer device 35 so that the plate member 12 is again transferred for a predetermined distance in the direction of the first transfer completed position (see FIG. 16).

In the way as described above, the control device 92 actuates the first transfer device 35 before completion of the lowering operation while on the other hand it actuates the output-side up-down device 22 before completion of the transfer operation of the first transfer device 35. Owing to partial overlapping of the operation of the output-side up-down device 22 and the operation of the first transfer device 35, it becomes possible to reduce the time for which the driving of the first transfer device 35 is stopped, and thus the transfer time of the transfer system 1 can be shortened. In addition, the first transfer device 35 is placed in operation after placement of the plate member 12, in other words, the first transfer device 35 is being placed out of operation at the time of placement of the plate member 12. Therefore, the control is simpler as compared to the case where the plate member 12 is placed after the first transfer device 35 is actuated. In addition, it becomes possible that the plate member 12 is placed reliably and free from damage on the first transfer device 35. In addition, it is not necessarily required that the operation of the output-side up-down device 22 and the operation of the first transfer device 35 be overlapped partially. For example, it may be arranged such that the first transfer device 35 is placed in operation after the operation of the output-side up-down device 22 is brought to a stop.

In addition, when the storage cassette 11 is raised by the output-side up-down device 22, the control device 92 controls the up-down motor 23 so that the raising speed is accelerated to a predetermined first speed from the stop state and then is decelerated to a stop. That is, the control device 92 controls the rate of acceleration and deceleration of the up-down motor 23 at that time. Further, when the plate member 12 is fed out by the first transfer device 35, the control device 92 controls the output motor 37 so that the transfer speed is accelerated to a predetermined second speed from the stop state and then is decelerated to a stop. That is, the control device 92 controls the rate of acceleration and deceleration of the output motor 37 at that time. This makes it possible to place the plate members 12 from the storage cassette 11 onto the first transfer device 35 in time, thereby improving the speed at which the plate member 12 is placed and the accuracy of position in which the plate member 12 is placed.

By control of the output-side up-down device 22 and the first transfer device 35 by the control device 92, the lowering operation of the output-side up-down device 22 (step S14) and the transfer operation of the first transfer device 35 (step S13) are alternately repeatedly carried out, that is, these operations are carried out intermittently. Consequently, the plate members 12 are fed out one after another from the storage cassette 11A and are transferred to the first transfer completed position. Then, before the treatment process flow returns to step S13 from step S14, the control device 92 confirms if the plate member 12 reaches the first transfer completed position by the transfer operation of the next step S13 (step S15). Once it is confirmed that the plate member 12 fed out from the first transfer device 35 is transferred to the first transfer completed position, step S16 begins in sync with step S14.

Step S16 is a first transfer/placing step in which the control device 92 actuates the first delta robot 50 so that the plate member 12 in the first transfer completed position is held by suctioning performed by the suction hand 55 and is transferred and placed onto any of the zones of the first tray 13. More specifically, upon transfer of the plate member 12 to the first transfer completed position, the control device 92 moves the suction hand 55 to above the first transfer completed position. Thereafter, the control device 92 lowers the suction hand 55 so that the plate member 12 is positioned interior to the four guides (not shown). Thereafter, the guides are moved inward for positioning of the plate member 12, which is followed by suctioning the plate member 12 against the bottom of the hand main body. Since the accuracy, at which the plate member 12 is transferred to the first transfer/placing position by the first transfer device 35, is high, this prevents the suction hand 55 from mal-suction of the plate member 12.

Figure 16:
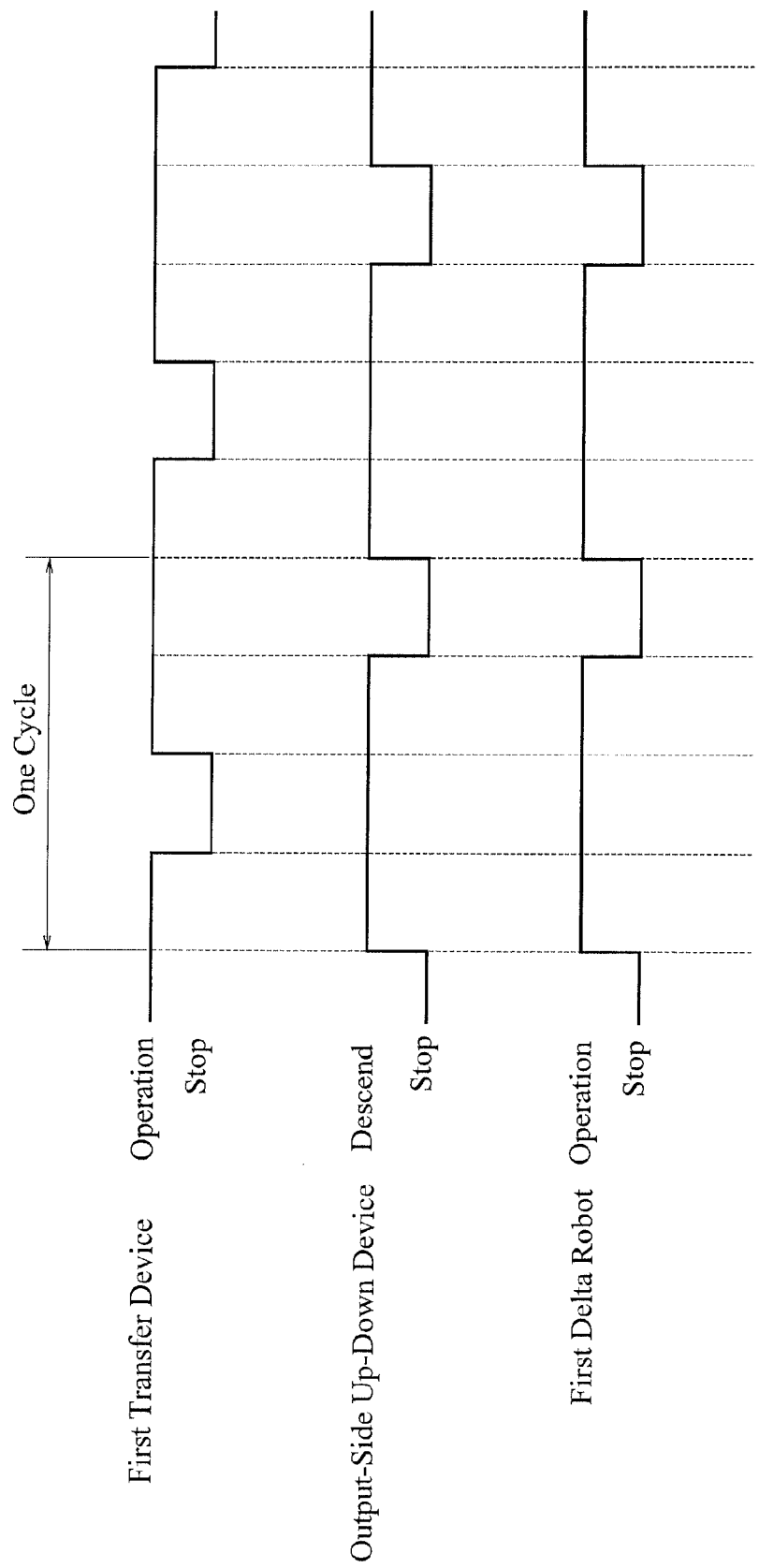
FIG. 16 is a diagram graphically showing cycle times respectively for the up-down device, the first transfer device and a first delta robot, during the transfer processing.
Figure 17:
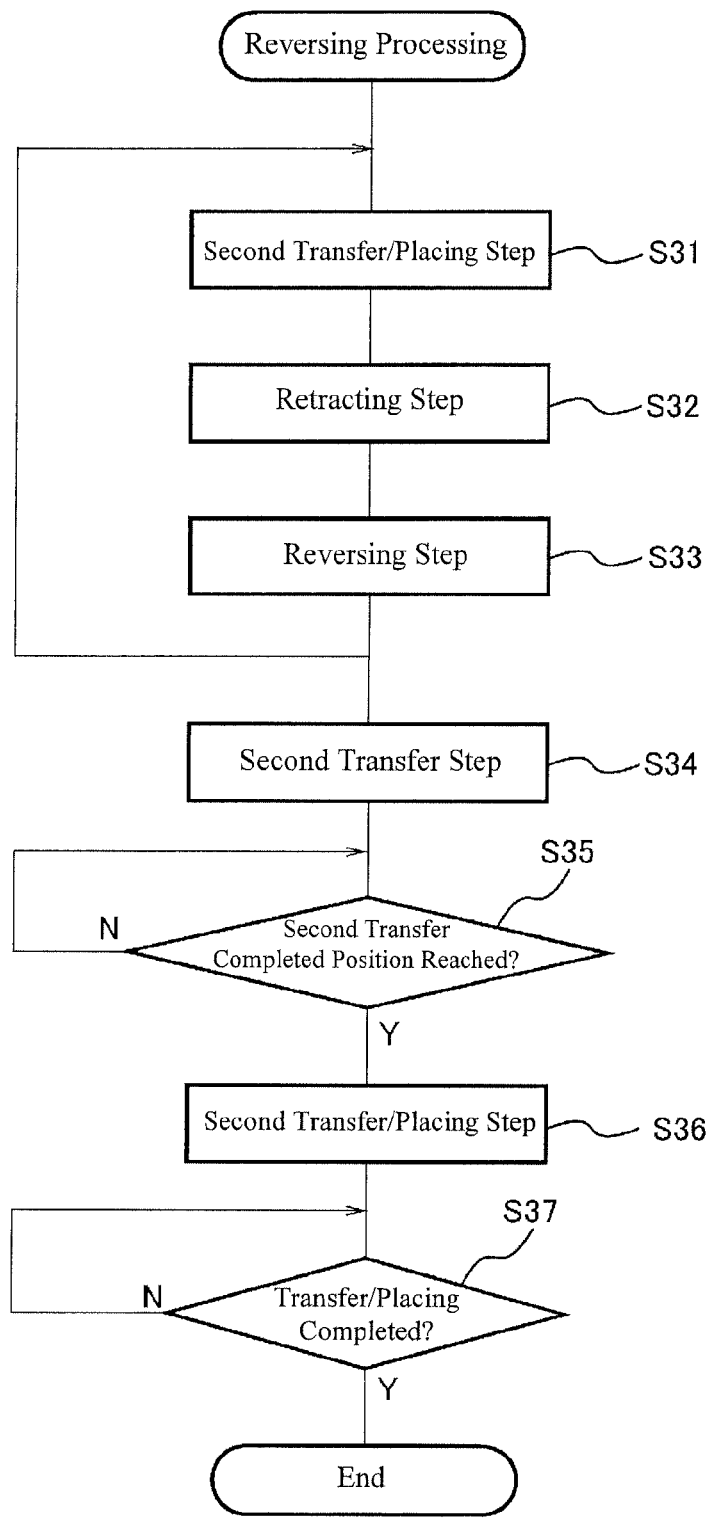
FIG. 17 is a flow chart showing a reversing-processing procedure to be executed in the reversing system.

Since the transfer/placing operation of step S16 is carried out in sync with the lowering operation of step S14, it is started before completion of the transfer operation of step S13 (see FIG. 16). On the other hand, the control device 92 stops the operation of the first transfer device 35 until the time that the first delta robot 50 holds by application of suction the plate member 12 on the first transfer device 35. Therefore, when compared to the case where the plate member 12 in motion is held by suctioning, the control is simpler because the first delta robot 50 applies suction to the plate member 12 at rest, thereby to hold it. In addition, by overlapping, it becomes possible to reduce the time for which the first transfer device 35 is stopped. This makes it possible to shorten the time taken for the transfer system 1 to transfer the plate member 12. In addition, it is not necessarily required that the operation of the first delta robot 50 and the operation of the first transfer device 35 be overlapped with each other. For example, it may be arranged such that the first transfer device 35 is actuated after the operation of the first delta robot 50 is brought into a stop.

After suctioning performed by the suction hand 55 to hold the plate member 12, the control device 92 moves the suction hand 55 to above a target zone of the first tray 13 onto which the plate member 12 is to be placed. Then, the control device 92 stops suctioning of the plate member 12 by the hand main body so that the plate member 12 is placed on the target zone. In addition, when the plate member 12 is to be sucked by the suction hand 55, the suctioning of the robot-side delivery section 36*d* is stopped beforehand by the control device 92 and suctioning of the plate member 12 transferred to the first transfer completed position has been stopped. Therefore, it becomes possible to suction the plate member 12 by the suction hand 55, thereby to hold it free from damage.

The operation of each of steps S13, S14 and S16 is repeatedly carried out until the plate members 12 are transferred and placed onto each of the zones of the first tray 13 (see step S17). In other words, if each of the zones of the first tray 13 is not loaded with the plate members 12, then step S16 is over together with step S14, upon which the treatment process flow again returns to step S13 and the transfer operation is carried out. And, immediately before completion of the transfer operation of step S13, the lowering operation of step S14 and the transfer/placing operation of step S16 are carried out in sync with each other. This makes it possible that the transfer operation of the first transfer device 35 is stopped only when the transfer/placing operation and the placing operation are being executed, otherwise the transfer operation can be continued thereby making it possible to further shorten the time for which the transfer device is stopped. This makes it possible to not only reduce the transfer time, but also to accomplish improvement in transfer efficiency.

In addition, in the transfer/placing operation of step S16, the control device 92 operates such that the plate members 12 are each placed one by one on a respective zone of the first tray 13 in a predetermined order, thereby preventing each of the zones of the first tray 13 from being loaded with the plurality of plate members 12.

In the way as described above, the lowering operation and the transfer operation are alternately repeatedly carried out, so that, as the plate members 12 are fed out one after another, the storage cassette 11A becomes empty of the plate members 12. Then, the control device 92 causes the up-down table 25 to move upward thereby to unlock the storage cassette 11B. After the storage cassette 11A is unlocked, the control device 92 operates the transfer robot 20 for the hand 21 to firmly grasp the storage cassette 11A and then causes the transfer robot 20 to remove the storage cassette 11B from the up-down table 25. Thereafter, the control devices 92 causes the storage cassette 11B removed by the transfer robot 20 to be placed on the standby table 91 and releases the storage cassette 11B from being held by the hand 21. Upon such release, the treatment process flow moves to step S11 and the now emptied up-down table 25 is again loaded with another storage cassette 11A.

In addition, whether or not all of the plate members 12 have been fed out from the inside of the storage cassette 11A is decided, for example, from the specified position at which the up-down table 25 is located when the uppermost plate member 12 in the storage cassette 11A is placed in the placement position (more specifically, the drive amount of the up-down motor). Alternatively, there may be provided a sensor so as to determine whether the uppermost plate member 12 is supported or not.

In addition, by repetition of each of the operations of steps S13, S14 and S16, the plate member 12 is finally transferred and placed onto each zone of the plurality of zones of the first tray 13 (step S17). Then, step S1 which is a transfer processing step on the first tray 13 is completed for now and the treating process moves to step S2.

In the way as described above, the transfer system 1 makes it possible to transfer a plurality of plate members 12 stored in the storage cassette 11A to the first transfer completed position while keeping them in a horizontal position, only by carrying out two steps, i.e., the lowering operation of the storage cassette 11A by the output-side up-down device 22 and the transfer operation of the plate members 12 by the first transfer device 35. Stated in another way, it is possible that a plurality of plate members 12 stored in the storage cassette 11A are directly transferred and placed onto the first transfer device 35 and are then fed out towards the first transfer completed position. In the way as described above, it is possible to minimize the operation needed for transfer/placing of the plate members 12. As a result, the plate members 12 can be fed out at high speeds.

And in the transfer system 1, the control device 92 operates the first transfer device 35 to remove the plate member 12 from the placement position so that the placement position is cleared, which is followed by placing of another plate member 12 in the now-cleared placement position, so that the plate members 12 in the storage cassette 11A are fed out sequentially therefrom without overlapping with each other. In addition, the up-down motor 23 and the output motor 37 are each implemented by a servo motor, thereby making it possible that the output-side up-down device 22 and the first transfer device 35 each function as a delivery device capable of control of the positioning of the plate member 12. This makes it possible to achieve improvements in transfer-position accuracy and in arrival time (timing) of the plate member 12 when transferred towards the transfer/placing robot. This makes it possible that the plate members 12 can be transferred and placed at higher speeds.

First Process Treatment

Step 2 is a first process treatment step in which the first tray 13 carrying thereon the plate members 12 is conveyed to the treatment chamber of the first process device 5 by the first conveying mechanism 14. By passage through the treatment chamber of the first process device 5, the obverse surface of the plate member 12 is subjected to a process treatment. Then, the process-treated plate member 12 is conveyed to under the second delta robot 60 by the first conveying mechanism 14. When conveyed to under the second delta robot 60, the first conveying mechanism 14 is brought to a halt, and the treatment process flow moves to step S3.

Reversing Processing

Step S3 is a reversing processing step in which the control device 92 controls the operation of each of the devices of the reversing system 2 so that the upper and the lower surfaces of the plate members 12 placed and carried on the first tray 13 are reversed and then arrayed on the second tray 15. Hereinafter, the reversing processing will be described in detail with reference to FIGS. 17 to 19.

When the reversing processing is started, the treatment process flow first moves to step S31. Step S31 is a second transfer/placing step in which the control device 92 operates the second delta robot 60 so that the suction hand 64 suctions any of the plate members 12 lying on the first tray 13 under the second delta robot 60, thereby to hold it. Then, the suction hand 64 is shifted so that the plate member 12 held by the suction hand 64 is moved to the first transfer/placing area 65. Consequently, the plate member 12 is moved onto the suction pads 73 of the reversing table 71 in a horizontal position with its obverse surface oriented in an upward direction (see FIG. 18A). Thereafter, the control device 92 releases the plate member 12 from being held by the suction hand 64, so that the plate member 12 is let down so that it is placed on the suction pads 73s of the reversing table 71. When the plate member 12 is released from being held by the suction hand 64 and then placed on the suction pads 73, the treatment process flow moves to step S32.

Figure 18A:
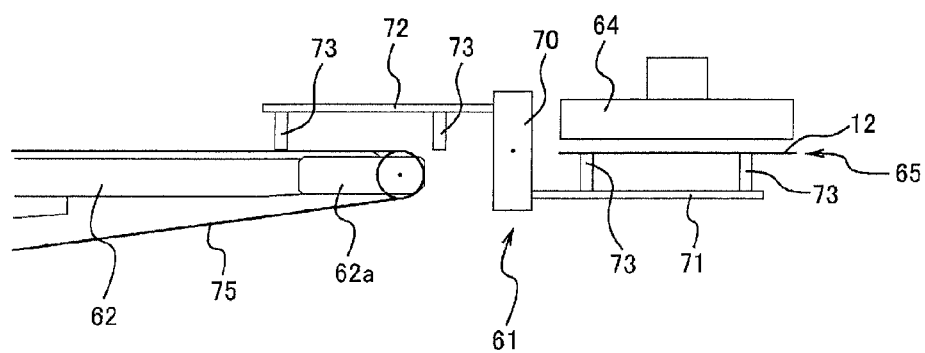
FIG. 18A is a rear view diagrammatically showing the reversing device in operation during the reversing processing.
Figure 18B:
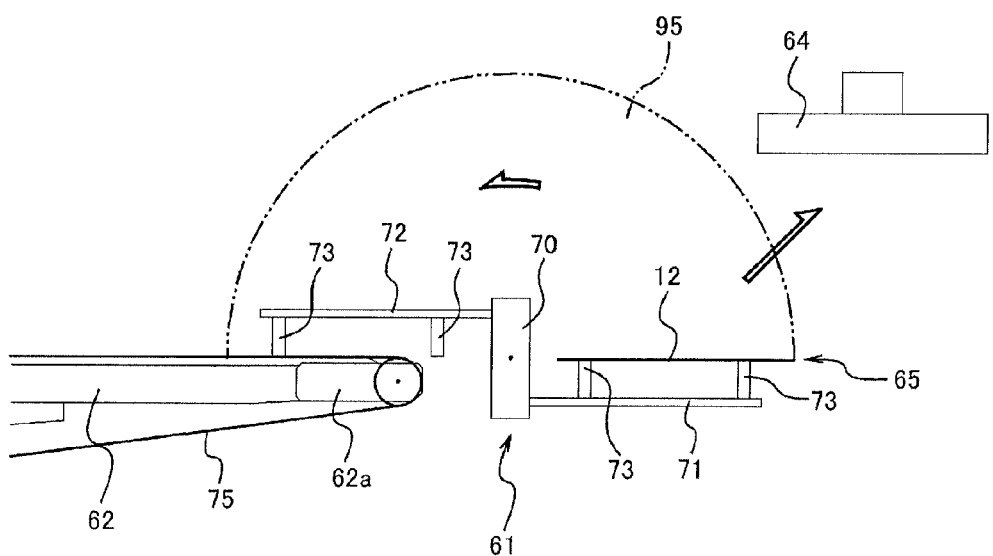
FIG. 18B is another rear view diagrammatically showing the reversing device in operation during the reversing processing.
Figure 18C:
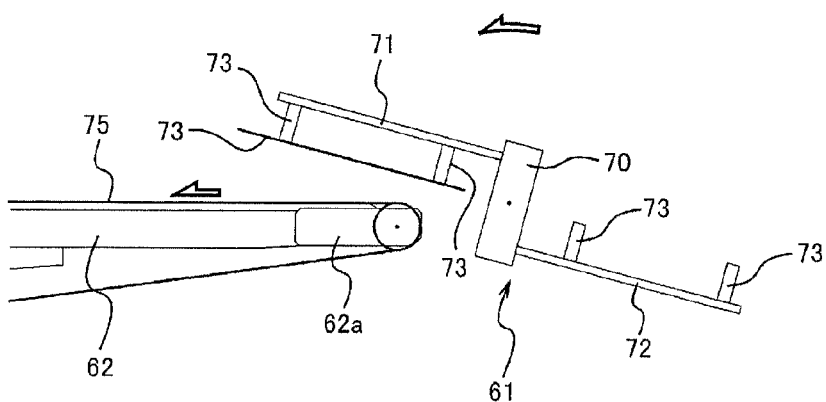
FIG. 18C is still another rear view diagrammatically showing the reversing device in operation during the reversing processing.
Figure 18D:
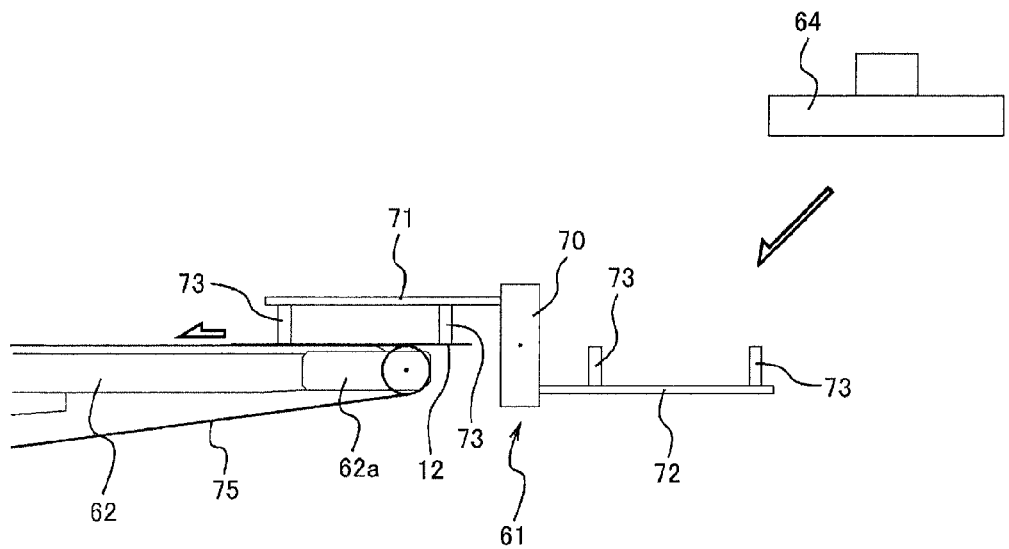
FIG. 18D is a rear view diagrammatically showing the reversing device in operation during the reversing processing.

Step S32 is a retracting step in which the control device 92 operates the second delta robot 60 so that the suction hand 64 is moved from the first transfer/placing area 65 so as to retract from within the range of movement of the reversing table 71, i.e., from within a region 95 indicated by two-dot chain line of FIG. 18B. After such retraction, the control device 92 brings the suction hand 64 back to a predetermined position for transfer/placing of the next plate member 12. In addition, after retraction of the suction hand 64, the treatment process flow moves to step S33.

Step S33 is a reversing step in which the control device 92 actuates the reversing motor 69 so that the reversing shaft 70 of the reversing device 61 is rotated. Upon rotation of the reversing shaft 70, the reversing table 71 moves towards the second transfer/placing area 66 while on the other hand the reversing table 72 moves towards the first transfer/placing area 65 (see FIG. 18C). In addition, at the same time that it actuates the reversing motor 69, the control device 92 actuates the suction mechanism 77 so that the lower surface of the plate member 12 is subjected to suctioning performed by the suction pads 73. This prevents the plate member 12 from falling when the reversing table 71 is being moved. In addition, only the lower surface (reverse surface) of the plate member 12 is subjected to suction by the suction pads 73, so that the plate member 12 can be reversed without making any contact with the upper surface (i.e., the process-treated surface).

And, the control device 92 stops the reversing motor 69 to stop the reversing device 61 when the reversing tables 71, 72 are in a receipt position and in a delivery position, respectively. Consequently, the suction pads 73 of the reversing table 71 on the side of the second transfer/placing area 66 are oriented so as to look downward, and the plate member 12 sucked by the suction pads 73 comes to locate in the second transfer/placing area 66 (see FIG. 18D). In other words, it is possible that the upper and the lower surfaces of the plate member 12 is reversed by the reversing device 61 and then transferred and placed onto the second transfer/placing area 66. On the other hand, the suction pads 73 of the reversing table 72 located on the side of the first transfer/placing area 65 are oriented so as to look upward, and the suction pads 73 are positioned in the first transfer/placing area 65.

Figure 18E:
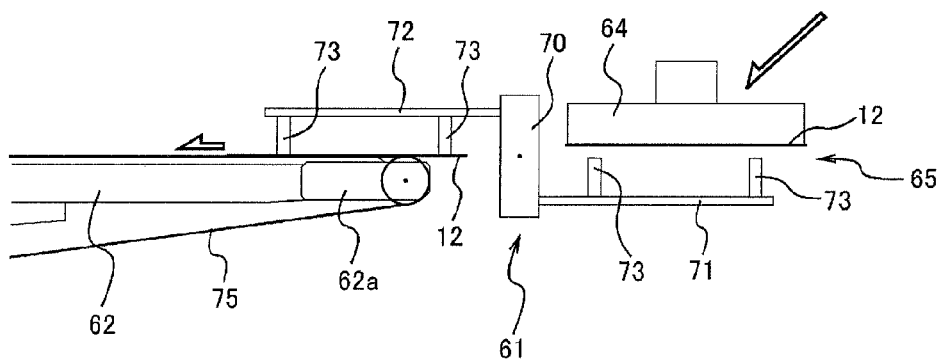
FIG. 18E is another rear view diagrammatically showing the reversing device in operation during the reversing processing.
Figure 18F:
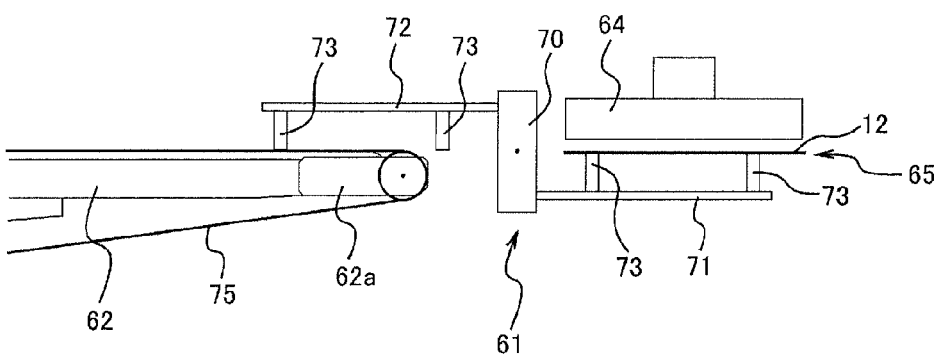
FIG. 18F is still another rear view diagrammatically showing the reversing device in operation during the reversing processing.
Figure 19:
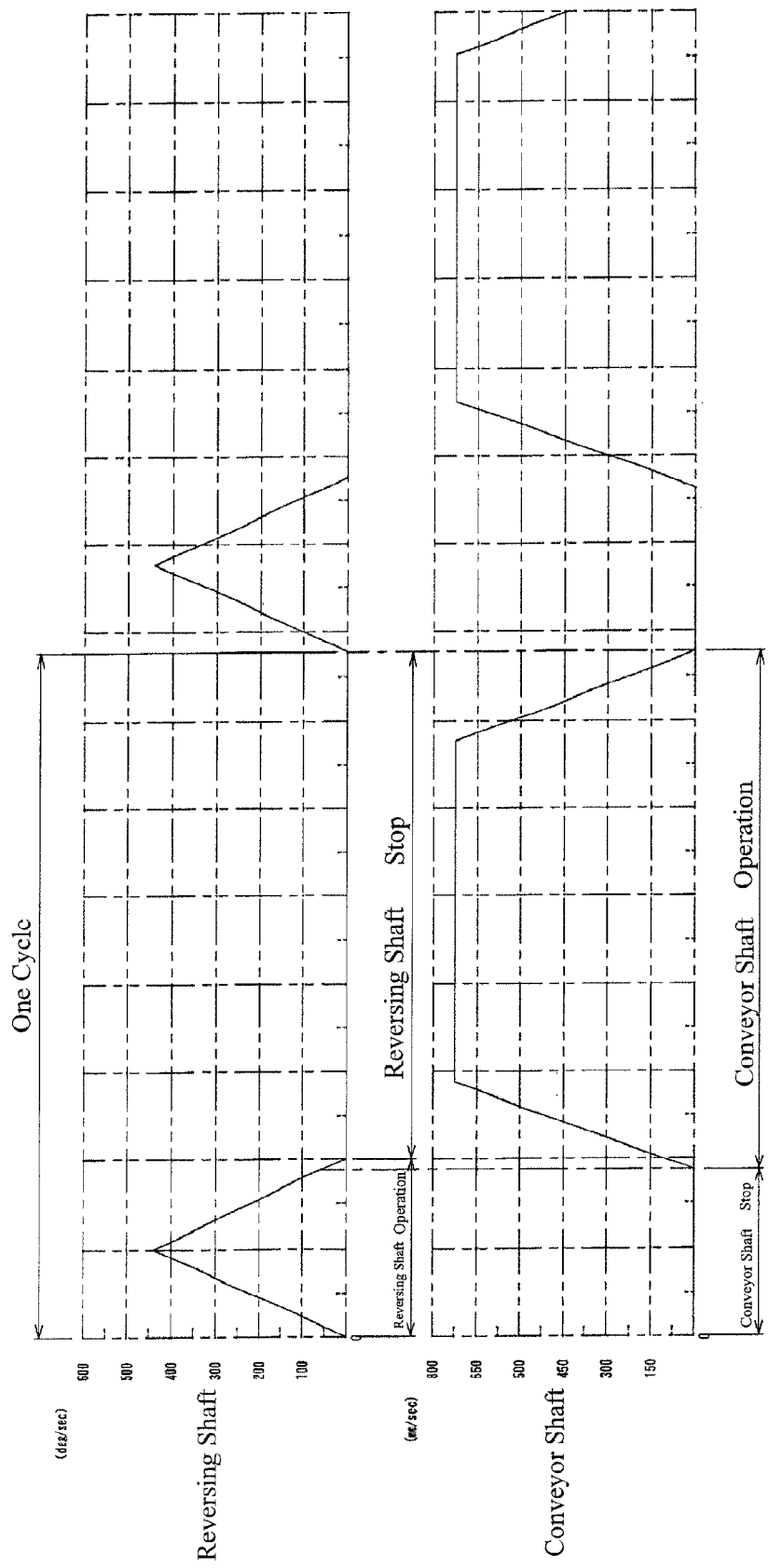
FIG. 19 is a diagram showing cycle times respectively for the reversing device and the second transfer device during the reversing processing.
Figure 20:
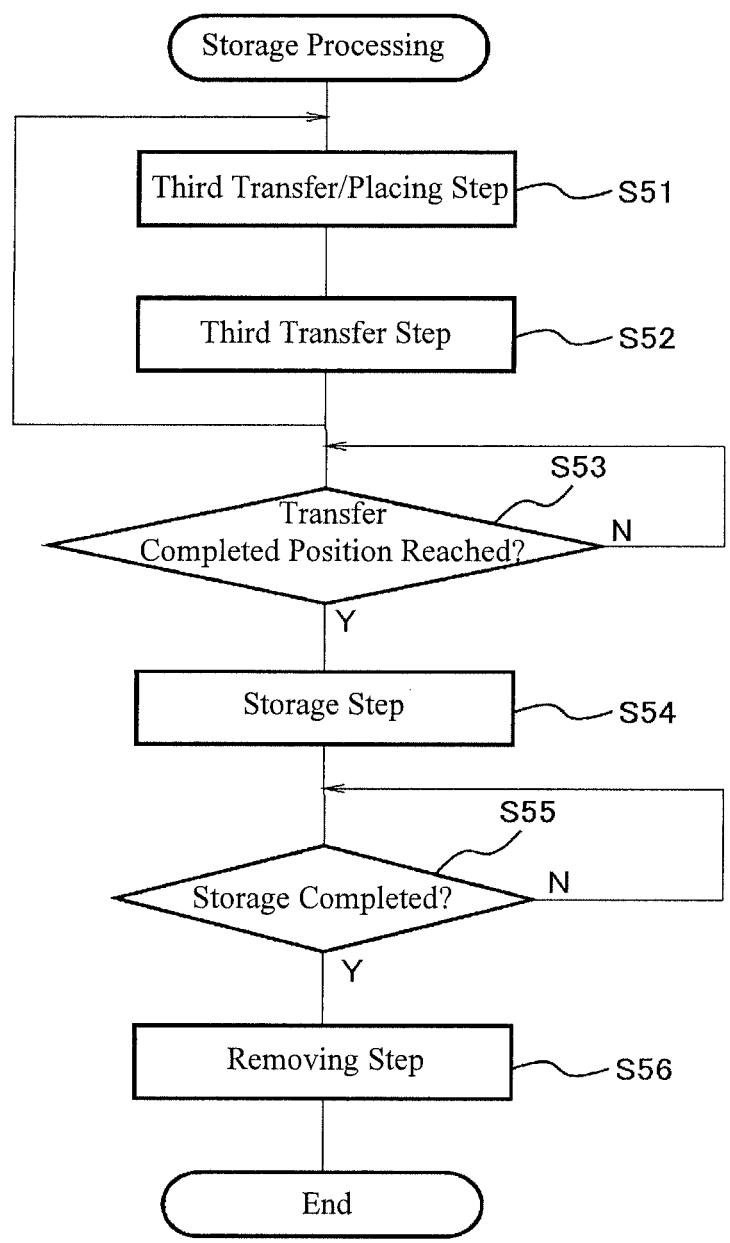
FIG. 20 is a flow chart showing a storage-processing procedure to be executed in a storage system.

The control device 92 stops the reversing device 61 and thereafter releases the plate member 12 from being held by suctioning performed by the suction pad 73 so that the plate member 12 is placed on the end 62a of the second transfer device 62 (see FIG. 18E). Upon placing of the plate member 12 on the end 62a of the second transfer device 62, the treatment process flow returns to step S31, which is followed by placing of the plate member 12 on the suction pads 73 of the reversing table 72 which has moved to the first transfer/placing area 65 (see FIG. 18F). And, the control device 92 causes step S34 to start in sync with step S31. Step S34 is a second transfer step in which the control device 92 operates the second transfer device 62 so that the plate member 12 placed on the one end 62a of the second transfer device 62 is transferred towards the second transfer/placing position. When starting transfer of the plate member 12, the control device 92 operates the conveyor belt 75 of the second transfer device 62 before the reversing shaft 70 of the reversing device 61 completely stops rotating, as shown in FIG. 19. In other words, the control device 92 compensates wasting time required for startup of the second transfer device 62. That is, the control device 92 provides control so that the plate member 12 is ready for transfer immediately after its placement. This reduces the time taken for transfer of the plate member 12. Referring to FIG. 19, there is shown on the upper side a graph relating to the speed of the reversing shaft 70 and there is shown on the lower side a graph relating to the speed of the conveyor belt 75. Both in the upper side and the lower side graphs, the vertical axis represents the speed whereas the horizontal axis represents the cycle time. In addition, the reversing operation and the transfer operation are not necessarily overlapped with each other.

In addition, at the time of transfer of the plate member 12, the control device 92 actuates the suction mechanism 77 so that the plate member 12 is sucked against the conveyor belt 75. The plate member 12 is transferred towards the second transfer completed position while it is being sucked against the conveyor belt 75. And, when the second transfer/placing area 66 becomes empty after the plate member 12 is transferred for a predetermined length of time and, in addition, when the retract operation of step S32 is completed, the control device 92 starts the reversing operation of step S33 so that the plate member 12 is transferred to the now-emptied second transfer/placing area 66. Then, the control device 92 stops movement of the conveyor belt 75 when the plate member 12 earlier placed on the conveyor belt 75 is transferred for a predetermined distance (i.e., for a distance corresponding to the length of the plate member 12). Further, after the conveyor belt 75 stops, the control device 92 provides control that causes the plate member 12 reversed to lie on the end 62a of the second transfer device 62.

By repetition of the reversing operation of the reversing device 61 and the transfer operation of the second transfer device 62 in the way as described above, the plate members 12 which are sequentially transferred and placed by the second delta robot 60 are reversed by the reversing device 61, then transferred and placed onto the second transfer device 62 and then transferred towards the second transfer completed position by the second transfer device 62. And, when the plate member 12 is transferred to the second transfer completed position (step S35), step S36 starts.

Step S36 which is a third transfer/placing step in which the control device 92 actuates the third delta robot 63 so that the plate member 12 in the second transfer completed position is held by suctioning performed by the suction hand 76 and then transferred and placed onto any of the zones of the second tray 15. At this time, prior to suctioning the plate member 12 by the suction hand 76, the control device 92 stops suctioning the plate member 12 transferred to the second transfer completed position.

In addition, by the control device 92, the transfer/placing operation of the third delta robot 63 (step S36) and the reversing operation of the reversing device 61 (step S33) are carried out in sync with each other. The transfer/placing operation (step S36) and the reversing operation (step S33) are partially overlapped with the transfer/placing operation of the second delta robot 60 (step S31) and the transfer/placing operation of the second transfer device 62 (step S34) which are in sync with each other. However, basically, the plate members 12 are delivered to the second delta robot 60 and to the second transfer device 62 when the transfer/placing operation of the second delta robot 60 and the transfer operation of the second transfer device 62 are stopped. On the other hand, the control device 92 causes step S31 (i.e., the transfer/placing operation of the second delta robot 60) and step S34 (i.e., the transfer operation of the second transfer device 62) to start before completion of the reversing operation (step S32) and before completion of the transfer/placing operation of the third delta robot 63 (step S36) but after an elapse of a predetermined time period from when the reversing operation and the transfer/placing operation of the third delta robot 63 are started. In other words, prior to completion of the operations of step S32 and step S36, the operations of step S31 and step S34 are started in a partially overlapping manner, and thus the suction hand 64 and the conveyor belt 75 are accelerated. This makes it possible to reduce the time for which the second delta robot 60 and the second transfer device 62 are stopped, thereby reducing the time taken for the reversing device 61 to reverse the plate member 12. Alternatively, it may be arranged such that, without any overlapping, step S32 and step S36 can be started after the operations of steps S31 and S34 are completely finished.

In addition, the transfer/placing operation of step S36 is repeatedly carried out until the plate member 12 is transferred and placed onto each zone of the plurality of zones of the second tray 15 (step S37). In doing so, the control device 92 causes step S36 to start immediately before completion of the transfer operation of step S34. Then, after the operation of step S34 is completed and the conveyor belt 77 is brought to a stop, the next plate member 12 now transferred to the second transfer completed position is held by suctioning performed by the third delta robot 63 and then transferred and placed onto the second tray 15. At the time of transfer and placing of the plate members 12, the control device 92 provides control that enables the plate members 12 to be placed, one by one and in a predetermined order, on their respective zones of the second tray 15, thereby preventing any one of the zones of the second tray 15 from being overloaded with a plurality of plate members 12. By repetition of the transfer/placing operation of step S36, the plate member 12 is transferred and paced onto each of the zones of the second tray 15, and step S3 which is a reversing processing step for the second tray 15 is over for now. Then, the treatment process flow moves to step S4.

As described above, in the reversing processing the control device 92 provides control that enables the second delta robot 60, the reversing device 61, the second transfer device 62 and the third delta robot 63 to operate intermittently, and during the transfer/placing operation of the third delta robot 63 (i.e., the transfer/placing operation on the downstream side) and the reversing operation of the reversing device 61, the transfer/placing operation of the second delta robot 60 (step S31) and the transfer operation of the second transfer device 62 (step s34) are partially stopped. On the other hand, during the time for which the transfer/placing operation of the third delta robot 63 (i.e., the transfer/placing operation on the downstream side) and the reversing operation of the reversing device 61 are stopped, the control device 92 provides control that causes the transfer/placing operation of the second delta robot 60 (i.e., the transfer/placing operation on the upstream side) and the transfer operation of the second transfer device 62 to be carried out in synchronization with each other.

As described above, by synchronization of the devices between which there is no delivery of the plate member 12, the time for which each device of the reversing system 2 is stopped can be shortened, thereby reducing the time taken for reversal and transfer of the plate member 12. In addition, during the time for which the second transfer device 62 is stopped so that the plate member 12 is delivered from the reversing device 61 to the second transfer device 62, the third delta robot 63 removes the plate member 12 from the second transfer device 62. As a result, it becomes possible to make effective use of the downtime of the second transfer device 62 and therefore to reduce the transfer time in the reversing system 2.

In addition, in the reversing system 2 the plate member 12 is held by suctioning performed by the suction pads 73 at the time when it is reversed. Thereby, not only the speed of reversal can be enhanced, but it is also possible to achieve improvement in accuracy of the delivery position of the plate member 12 at the time of delivery to the second transfer device 62. Furthermore, since the upper surface is opened at the time of reversal, the upper and the lower surfaces of the plate member 12 transferred and placed can be reversed and then handed over to the second transfer device 62 without any damage to the upper surface thereof. In addition, since the plate member 12 is held by suctioning performed by the suction pads 73, the plate member 12 can be reversed without less application of unnecessary force thereto, when compared to the case where the plate member 12 is grasped. This makes it possible that the present invention can be applicable to the case where plate members of various forms and materials (for example, films having a small thickness) are to be reversed.

In addition, in spite of the configuration in which the reversing operation and the suction operation are commenced at the same time in the reversing system 2, the plate member 12 remains held by suctioning it even when the suction force applied is small immediately after start of the suction operation, for the plate member 12 is placed on the suction pads 73 immediately after start of the reversing operation. Therefore, it becomes possible to start the reversing operation and the suction operation at the same time, thereby reducing the downtime of the reversing device 61. This makes it possible to shorten the time taken for reversal and transfer of the plate member 12.

Second Process Treatment

Step S4 is a second process treatment step in which the second tray 15 carrying thereon the plate members 12 is conveyed to the treatment chamber of the second process device 6 by the second conveying mechanism 16. By passage through the treatment chamber of the second process device 6, the obverse surface of the plate member 12 undergoes a process treatment. The process-treated plate member 12 is then conveyed to under the fourth delta robot 81 by the second conveying mechanism 16. When conveyed to under the fourth delta robot 81, the second conveying mechanism 16 is brought to a stop, and the treatment process flow moves to step S5.

Storage Processing

Step S5 is a storage processing step in which the control device 92 controls the operation of each of the devices of the storage system 3 so that the plate members 12 carried on the second tray 15 are stored one by one in the storage cassette 11B. Hereinafter, the storage processing will be described in detail with reference to FIG. 20.

The control device 92 first places the transfer robot 20 in motion prior to execution of the storage processing so that the storage cassette 11B on the standby table 91 is grasped by the hand 21. And the storage cassette 11B thus grasped by the hand 21 is placed on the empty up-down table 89 in the storage-side up-down device 83. Thereafter, the up-down table 89 is moved downward until the uppermost support sections 11g in the storage cassette 11B become located in the transfer completed position over the up-down device-side delivery section 85b of the third transfer device 82. Then, the storage system 3 waits for execution of the storage processing, with the up-down table 89 remaining in a lowered position.

Upon start of the storage processing, the treatment process flow first moves to step S51. Step S51 is a third transfer/placing step in which the control device 92 actuates the fourth delta robot 81 so that any one of the plate members 12 placed on the second tray 15 under the fourth delta robot 81 is held by suctioning performed by the suction hand 84. Then, the suction hand 84 is shifted so that the plate member 12 held by the suction hand 84 is moved to the transfer/placing position over the robot-side delivery section 85a of the third transfer device 82. Consequently, the plate member 12 lies in a horizontal position over the third transfer device 82. Thereafter, the control device 92 releases the plate member 12 from being held by the suction hand 84. After release of the plate member 12, the treatment process flow moves to step S52.

Step 52 is a third transfer step in which the control device 92 provides control that moves the third transfer device 82 so that the plate member 12 placed in the transfer/placing position is transferred to the transfer completed position. At this time, the control device 92 causes the suction mechanism 94 to suction the plate member 12. The plate member 12 is transferred to the transfer completed position, while being sucked by the suction mechanism 94. Thereafter, the control device 92 stops movement of the conveyor belt 86 when the plate member 12 is transferred a predetermined distance. In addition, the control device 92 provides control that, if, before the conveyor belt 86 is stopped, the transfer/placing position becomes empty after an elapse of a predetermined time period, the treatment process flow returns to step S51 (the transfer/placing operation) so that another plate member 12 is transferred and placed onto the now emptied transfer/placing position by the fourth delta robot 81. By repeated execution of the transfer/placing operation and the transfer operation, the plate member 12 is finally moved to the transfer completed position. When moved to the transfer completed position, the plate member 12 is inserted into the storage cassette 11B. In addition, the control device 92 causes step S54 to start in synchronization with the transfer/placing operation of step S52 immediately before the plate member 12 is moved to the transfer completed position.

Step S54 is a storage step in which the control device 92 operates the storage-side up-down device 83 to move the up-down table 89 upward. When the up-down table 89 ascends, the plate member 12, which has arrived at the transfer completed position and stopped there (step S53), is then raised upward, with its both ends supported by the support sections 11g. Consequently, the plate member 12 is separated from the third transfer device 82 and is stored in the storage cassette 11B. When the up-down table 89 is moved upward just for a height equal to a predetermined interval by which the support sections 11g are separated vertically, the control device 92 stops the storage-side up-down device 83. In addition, the control device 92 provides control that causes, before the storage-side up-down device 83 is brought to a stop, the treatment process flow to return to step S52 so that the third transfer device 82 starts operating. After the storage-side up-down device 83 is stopped, the control device 92 causes the next plate member 12 to move to the transfer completed position for insertion thereof into the storage cassette 11B. By repetition of this operation, the plate members 12 are stored in the storage cassette 11B in such a manner that they are arrayed in a vertical direction. By synchronized execution of the storage operation of step S54 and the transfer/placing operation of step S51, it becomes possible to reduce the time taken for the storage system 3 to store the plate members 12.

The storage operation of step S54 is repeatedly carried out until the plate member 12 is transferred and placed onto each of the shelves of the storage cassette 11 (step S55), and when the plate member 12 is stored at the lowermost support sections 11g, the treatment process flow moves to step S56. Step S56 is a removal step in which the control device 92 controls the fourth delta robot 81 and the third transfer device 82 to stop operating. Then, the control device 92 operates the storage-side up-down device 83 to move the up-down table 89 upward so that the storage cassette 11B becomes unlocked. After the storage cassette 11B is unlocked, the control device 92 operates the transfer robot 20 so that the storage cassette 11B placed on the up-down table 89 is held and then placed on the carrying-out table 90 by the hand 21. This completes the storage processing, and the treatment in the treatment equipment 4 is now completed. In addition, after the storage cassette 11B is removed from the up-down table 89, the control device 92 operates the transfer robot 20 in order that another storage cassette 11B placed on the standby table 91 is placed on the now emptied up-down table 89.

Other Embodiments

In the first to the fourth delta robots 50, 60, 63, 81 of the present embodiment, their respective suction hands 55, 64, 76, 84 suctions the plate member 12, thereby to hold it. Alternatively, it is possible to employ a hand of the type that grasps the plate member 12. In addition, the type of robot used for transfer and placing of the plate member 12 is not limited to the first to the fourth delta robots 50, 60, 63, 81. For example, it is possible to employ a six-axis robot, a horizontal three-axis robot or the like.

Further, in the present embodiment, the reversing device 61 is configured such that the plate member 12 is held by suctioning performed by the suction pads 73, which however should not be considered limitative. For example, the plate member 12 may be grasped from the side by a hand or the like, and it suffices if the plate member 12 is retained, with its upper surface in an open state.

In addition, according to the transfer processing (the storage processing) of the present embodiment, the output-side up-down device 22 (the storage-side up-down device 83) and the first delta robot 50 (the fourth delta robot 81) are synchronized with each other; however, they are not necessarily synchronized with each other. For example, it may be arranged such that the lowering operation of the output-side up-down device 22, the transfer operation of the first transfer device 35 and the transfer/placing operation of the first delta robot 50 are carried out in that order. In regard to the reversing processing of the present embodiment, the second delta robot 60 and the second transfer device 62 are not necessarily synchronized with each other, and in addition, the reversing device 61 and the third delta robot 63 are not necessarily synchronized with each other. Like the transfer processing, for example, each device may be placed in operation one after another.

Numerous modifications and alternative embodiments of the present invention will be apparent to those skilled in the art in view of the foregoing description. Accordingly, the description is to be construed as illustrative only, and is provided for the purpose of teaching those skilled in the art the best mode of carrying out the present invention. The details of the structure and/or function may be varied substantially without departing from the spirit of the present invention and all modifications which come within the scope of the appended claims are reserved.

REFERENCE SIGNS LIST

2: Reversing System
60: Second Delta Robot
61: Reversing Device
62: Second Transfer Device
63: Third Delta Robot
65: First Transfer/Placing Area
66: Second Transfer/Placing Area
70: Reversing Shaft
73: Suction Pad
77: Suction Mechanism
92: Control Device

The invention claimed is:

1. A plate member reversing system for sequentially reversing and transferring a plurality of plate members including a first plate member and a second plate member, the plate member reversing system comprising:
   an upstream-side transfer/placing robot including an arm and configured to perform an upstream-side transfer/placing operation using the arm to sequentially hold, transfer and place the plurality of plate members;
   a reversing device including a pair of reversing tables onto each of which the plate member held by the arm of the upstream-side transfer/placing robot is transferred and placed in a horizontal position, the reversing device being configured to perform a reversing operation of reversing upper and lower surfaces of the plate member transferred to and placed on each of the reversing tables, while the transferred and placed plate member is being held with its upper surface in an open state;
   a transfer device configured to perform a transfer operation of receiving the reversed plate member from the reversing device and transferring the received plate member in a reversed state and in a horizontal position; and
   a control device which executes control that enables the upstream-side transfer/placing robot, the reversing device and the transfer device to operate intermittently, wherein:
   the transfer device is a belt conveyor;
   the reversing device reverses the first plate member, transferred to and placed on one of the reversing tables by the arm of the upstream-side transfer/placing robot; and places the first plate member onto the belt conveyor to deliver the first plate member to the belt conveyor, and the reversing device causes the other of the reversing tables to receive the second plate member transferred and placed by the arm of the upstream-side transfer/placing robot, the second plate member being different from the first plate member; and
   the control device is configured such that while the upstream-side transfer/placing robot is caused to use the arm to perform the upstream-side transfer/placing operation to transfer and place the second plate member to and on the other of the reversing tables in a state in which the reversing operation of the reversing device is stopped, the control device causes the transfer device to perform the transfer operation simultaneously and in sync with the upstream-side transfer/placing operation by the upstream-side transfer/placing robot to deliver the first plate member, transferred to and placed on the one of the reversing tables, to the belt conveyor.

2. The plate member reversing system as set forth in claim 1, wherein the control device is configured such that, after causing the upstream-side transfer/placing robot to perform the upstream-side transfer/placing operation, the control device causes the upstream-side transfer/placing robot to perform a retracting operation to retract from the reversing device, while causing the reversing device to perform the reversing operation.

3. The plate member reversing system as set forth in claim 1, wherein the reversing device includes a suction pad, provided at each of the reversing tables, for suctioning the lower surface of the placed first plate member, thereby to hold the first plate member, and a reversing shaft for rotating the reversing tables so that the first plate member is reversed.

4. The plate member reversing system as set forth in claim 3, wherein the control device is configured to cause the reversing device to perform the reversing operation and the suction pad to perform a suction operation.

5. The plate member reversing system as set forth in claim 2, further comprising:
   a downstream-side transfer/placing robot, whose operation is controlled by the control device, for holding, and transferring and placing the plate member transferred to a transfer/placing completed position by the transfer device;
   wherein the control device is configured such that, while the reversing device is caused to perform the reversing operation in a state in which the transfer operation of the transfer device is stopped, the control device causes the downstream-side transfer/placing robot to perform a downstream-side transfer/placing operation so that the first plate member transferred to the transfer/placing completed position by the transfer device is transferred and placed in a predetermined position.

6. The plate member reversing system as set forth in claim 5,
wherein the transfer device includes a suction mechanism for suctioning the lower surface of the plate member to be transferred; and
wherein, after receipt of the first plate member from the reversing device, the suction mechanism starts suctioning the received first plate member and stops suctioning at the transfer completed position.

7. A plate member reversing/transfer method for use in a plate member reversing system which includes: an upstream-side transfer/placing robot configured to use an arm to sequentially hold, transfer and place a plurality of plate members including a first plate member and a second plate member; a reversing device including a pair of reversing tables onto each of which the plate member held by the arm of the upstream-side transfer/placing robot is transferred and placed in a horizontal position, the reversing device being configured to reverse upper and lower surfaces of the plate member transferred to and placed on each of the reversing tables, while the transferred/placed plate member is being held with its upper surface in an open state; and a transfer device configured to perform a transfer operation of receiving the reversed plate member from the reversing device and transferring the received plate member in a reversed state and in a horizontal position, the transfer device being a belt conveyor, wherein the reversing device reverses the first plate member, transferred to and placed on one of the reversing tables, and places the first plate member onto the belt conveyor to deliver the first plate member to the belt conveyor, and the reversing device causes the other of the reversing tables to receive the second plate member transferred and placed by the arm of the upstream-side transfer/placing robot, the second plate member being different from the first plate member, the method comprising:
    a transfer/placing step in which the plurality of plate members are sequentially held by the upstream-side transfer/placing robot, and are transferred and placed onto the other of the reversing tables of the reversing device;
    a reversing step in which the plate member transferred and placed onto the one of the reversing tables in the transfer/placing step is delivered to the transfer device in such a manner that the reversing device holds and reverses the plate member and places the plate member onto the belt conveyor; and
    a transfer step in which the plate member reversed and delivered in the reversing step is transferred by the transfer device, wherein
while the transfer/placing step is being executed in a state where a reversing operation of the reversing device is stopped after the reversing step, the transfer step is executed simultaneously and in sync with the transfer/placing step.

* * * * *